US012762310B1

(12) United States Patent
Larkin et al.

(10) Patent No.: US 12,762,310 B1
(45) Date of Patent: Oct. 13, 2026

(54) FEEDBACK INTEGRATED RETRIEVAL AUGMENTED GENERATION (RAG) FRAMEWORK

(71) Applicant: Optum Services (Ireland) Limited, Dublin (IE)

(72) Inventors: Kevin Larkin, Kildare (IE); Conor Brian Breen, Dublin (IE); Fadong Yan, Basking Ridge, NJ (US); Jamie Howard, Donegal (IE)

(73) Assignee: Optum Services (Ireland) Limited, Dublin (IE)

( * ) Notice: Subject to any disclaimer, the term of this patent is extended or adjusted under 35 U.S.C. 154(b) by 0 days.

(21) Appl. No.: 19/179,481

(22) Filed: Apr. 15, 2025

(51) Int. Cl.

| | |
|---|---|
| ***G06F 30/20*** | (2020.01) |
| ***G06F 16/3329*** | (2025.01) |
| ***G06F 16/3332*** | (2025.01) |
| ***G06F 30/27*** | (2020.01) |

(52) U.S. Cl.
CPC .......... *G06F 30/27* (2020.01); *G06F 16/3329* (2019.01); *G06F 16/3335* (2019.01)

(58) Field of Classification Search
CPC ... G06F 16/3329; G06F 16/3335; G06F 30/27
See application file for complete search history.

(56) References Cited

U.S. PATENT DOCUMENTS

| | | | | |
|---|---|---|---|---|
| 12,124,966 | B1 | 10/2024 | Alperin | |
| 2025/0046407 | A1 | 2/2025 | Santiago | |
| 2026/0111456 | A1 * | 4/2026 | Kunz | G06F 16/3329 |

FOREIGN PATENT DOCUMENTS

| | | | |
|---|---|---|---|
| CN | 117454990 | B | 7/2024 |
| CN | 119166786 | A | 12/2024 |
| CN | 119128607 | B | 1/2025 |
| JP | 7601361 | B1 | 12/2024 |

OTHER PUBLICATIONS

Pulicharla, Mohan Raja, "Hybrid Quantum-Classical Machine Learning Models: Powering the Future of AI", Journal of Science & Technology, vol. 4, Issue 1, Jan. 2023, (26 pages), doi:10.55662/JST.2023.4102.

* cited by examiner

*Primary Examiner* — Diedra McQuitery
(74) *Attorney, Agent, or Firm* — Alston & Bird LLP

(57) ABSTRACT

Various embodiments of the present disclosure provide a feedback integrated retrieval augmented generation (RAG) framework that improves the functionality of a computer in various aspects. The techniques comprise receiving a query comprising a request content for a generative model and generating, using an embedding model, a query embedding for the query by embedding the request content. The techniques comprise receiving, from a RAG datastore, a content chunk based on the query embedding and a content embedding of the content chunk, wherein the content chunk is assigned a preprocessing tag. The techniques comprise generating a generative prompt for the query and that comprises (i) prompt instructions, (ii) the request content, and (iii) the content chunk and generating, using the generative model, a generative output based on the generative prompt. The techniques comprise routing the generative output based on the preprocessing tag.

20 Claims, 7 Drawing Sheets

FEEDBACK INTEGRATED RETRIEVAL AUGMENTED GENERATION (RAG) FRAMEWORK

BACKGROUND

In many domains, large volumes of unstructured data accumulate over time, presenting difficulties for efficient information retrieval and utilization for downstream tasks, such as query processing or, in machine learning contexts, retrieval augmented generation (RAG) pipelines. Traditional information retrieval systems, for example, may struggle to effectively process and present relevant information from extensive datasets due to changes in the factual or procedural accuracy of the data over time. For example, data accessed at a particular time point may be relevant, accurate, and reliable until the data is changed at its originating source. This phenomenon is referred to as data staleness, which describes the tendency of information becoming outdated, inaccurate, or irrelevant over time due to changes within a domain.

Data staleness leads to several technical challenges in data maintenance that negatively impact downstream systems in various ways. For example, in the context of machine learning, data staleness may lead to inaccuracies in machine learning models that cause the model's performance to drift (e.g., decreases in accuracy) over time as data within the real world diverges from the training dataset used to train the model. These same challenges may impact models even if they are not directly trained using stale data. For instance, in RAG frameworks, instruction finetuning techniques may be applied to augment a generative prompt with contextual examples from a RAG datastore. In such contexts, data staleness may lead to the incorporation of inaccurate, outdated, or obsolete data within a generative prompt, which may result in hallucinations and other model degradations that may reduce the performance of a generative model over time. This reduces the efficacy of RAG frameworks in dynamically changing domains and prevents the reliable use of RAG frameworks for sensitive computing tasks due to a lack of reliability and/or adaptability to changes within a particular environment.

DETAILED DESCRIPTION

Figure 1:
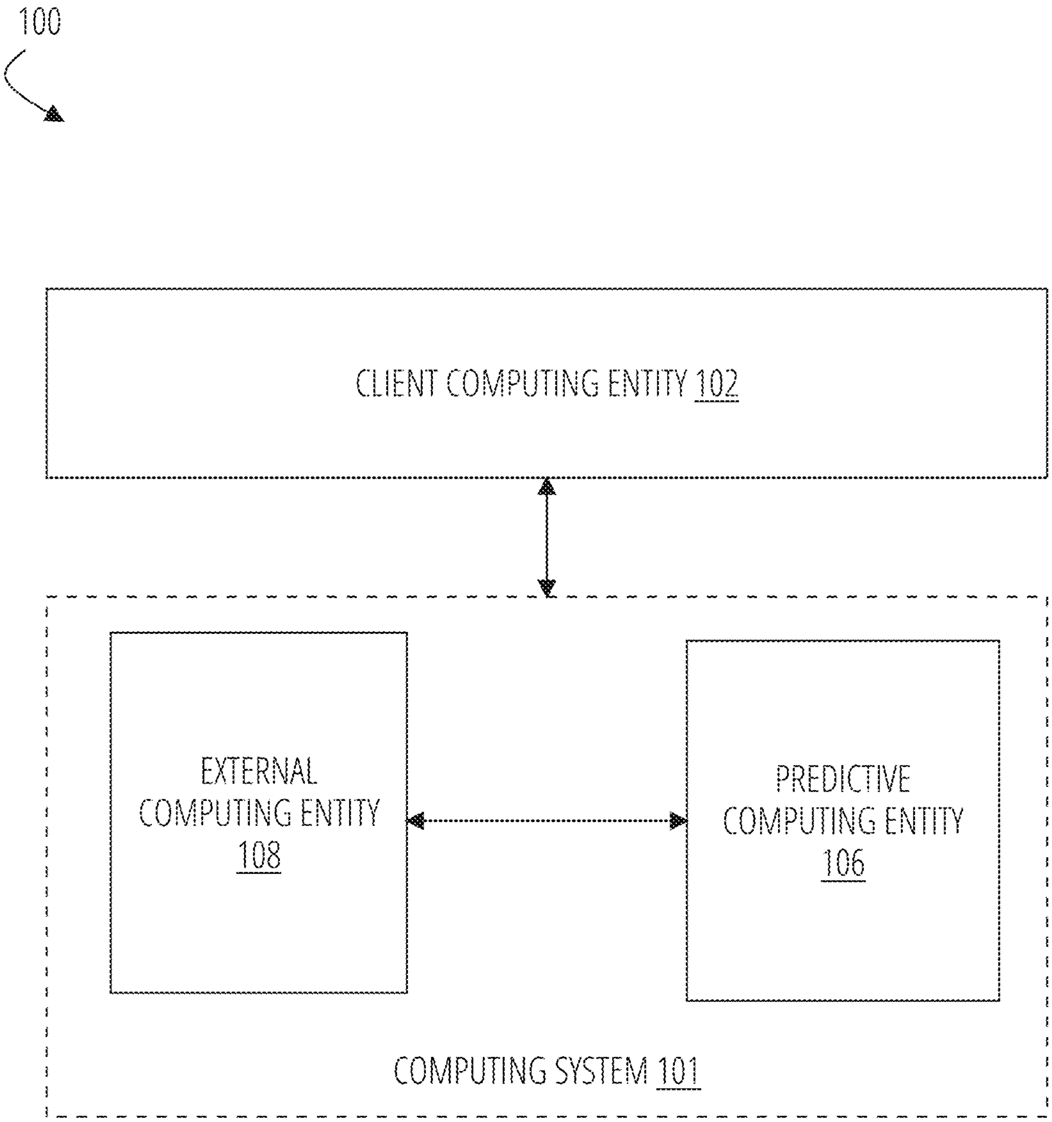
FIG. 1 is a block diagram of an example architecture in accordance with some embodiments of the present disclosure.

Various embodiments of the present disclosure address technical challenges related to machine learning technology, such as RAG pipelines that traditionally suffer from data staleness challenges. To do so, the various embodiments of the present disclosure provide a feedback integrated RAG framework that integrates dynamic feedback loops within a RAG pipeline to continuously and selectively refresh data within a RAG datastore during use of the RAG pipeline. The framework, for example, may integrate two feedback loops within a RAG pipeline that may be selectively triggered using preprocessing tags linked to up to each of a set of data chunks within a RAG datastore. For example, a first preprocessing tag may comprise a confirmation tag that may be assigned to procedural data chunks (e.g., data chunks that detail portions of procedural guidelines) and may be used to trigger a voting feedback process for data chunks that have not been independently confirmed by agents associated with a particular procedure. As another example, a second preprocessing tag may comprise a verification tag that may be assigned to factual data chunks (e.g., data chunks that detail verifiable facts) and may be used to trigger an external verification process for data chunks that have not been independently verified within a timing interval. The feedback integrated RAG framework may leverage one or both tags to monitor and enhance the accuracy of up to each data chunk within a RAG datastore according to the type of information referenced within the data chunk. For example, using the preprocessing tags, a different dynamic feedback loop may be triggered during an iteration of the RAG pipeline to confirm or verify the data integrated within a generative prompt. This, in turn, enables the iterative confirmation and/or verification of information within the RAG datastore at up to each iteration of the feedback integrated RAG framework. By doing so, the feedback integrated RAG framework provides a solution to data staleness that may improve the performance of generative models within dynamically changing environments by overcoming performance deficiencies with traditional RAG pipelines, such as potential inaccuracies or hallucinations due to a lack of adaptability to changes within the dynamically changing environments.

More particularly, to address technical challenges with maintaining data accuracy, some embodiments of the present disclosure provide tag-based feedback schemes for a RAG datastore. The tag-based feedback schemes may maintain an up to date representation of the data within the RAG datastore by assigning preprocessing tags, such as confirmation tags and verification tags, to up to each data chunk within the RAG datastore. Through a first tag-based feedback scheme, a confirmation tag may be modified responsive to receiving a threshold number of voting inputs from a set of agents within a domain, allowing for community validation of content that iteratively confirms the data within the RAG datastore over time. Through a second feedback mechanism, a verification tag may be modified to verify data responsive to an independent verification response from an external data source. After verification, the verification tag may be modified to revoke a verification responsive to an elapsed time from a verification timestamp meeting or exceeding a verification time interval; thereby, enforcing regular updates of factual information through independent verifications at a defined time frequency. In this way, the tag-based feedback schemes of the present disclosure overcome the limitations of static RAG datastores by creating a self-improving system that adapts to new information and corrections over time.

In some embodiments, the feedback integrated RAG framework further enhances data reliability by implementing distinct processes for handling confirmed, unconfirmed, and/or unverified content through routing logic for a generative output. For example, for confirmed or verified content (e.g., a generative output created using a generative prompt with confirmed and/or verified content chunks), a generative output may be provided directly in response to a query. For unconfirmed content (e.g., a generative output created using a generative prompt with an unconfirmed content chunk), the feedback integrated RAG framework may initiate a voting process before returning the generative output, potentially leading to confirmation and storage of new validated content in the RAG datastore. For unverified content (e.g., a generative output created using a generative prompt with an unverified content chunk), the feedback integrated RAG framework interfaces with external data sources for verification before returning the generative output, ensuring that only verified information is used in responses. In this way, the feedback integrated RAG framework may iteratively enhance a RAG datastore, while enforcing confirmation and verification safeguards for unconfirmed and unverified portions of the RAG datastore. This, in turn, may improve the accuracy and reliability of generative models leveraged within the feedback integrated RAG framework. For example, by implementing feedback integrated RAG framework, embodiments of the present disclosure enable more accurate, reliable, and efficient RAG pipelines. This, in turn, enhances the overall performance of AI-driven information retrieval and generation tasks, providing a significant advancement in the field of machine learning as well as downstream systems, such as robotic systems, the rely on the outputs of generative models.

Examples of technologically advantageous embodiments of the present disclosure comprise a distribution of functionality within RAG pipeline that improves the performance of generative machine learning models, among other aspects of the present disclosure. Other technical improvements and advantages may be realized by one of ordinary skill in the art.

I. OVERVIEW OF EMBODIMENTS

As should be appreciated, various embodiments of the present disclosure may be implemented as methods, apparatus, systems, computing devices, computing entities, computer program products, and/or the like. As such, embodiments of the present disclosure may take the form of an apparatus, system, computing device, computing entity, and/or the like executing instructions stored on a computer-readable storage medium to perform certain steps or operations. Thus, embodiments of the present disclosure may take the form of an entirely hardware embodiment, an entirely computer program product embodiment, and/or an embodiment that comprises a combination of computer program products and hardware performing certain steps or operations.

Embodiments of the present disclosure are described below with reference to block diagrams and flowchart illustrations. Thus, it should be understood that each block of the block diagrams and flowchart illustrations may be implemented in the form of a computer program product, an entirely hardware embodiment, a combination of hardware and computer program products, and/or apparatus, systems, computing devices, computing entities, and/or the like carrying out instructions, operations, steps, and similar words used interchangeably (e.g., the executable instructions, instructions for execution, program code, and/or the like) on a computer-readable storage medium for execution. For example, retrieval, loading, and execution of code may be performed sequentially such that one instruction is retrieved, loaded, and executed at a time. In some example embodiments, retrieval, loading, and/or execution may be performed in parallel such that multiple instructions are retrieved, loaded, and/or executed together. Thus, such embodiments may produce specifically configured machines performing the steps or operations specified in the block diagrams and flowchart illustrations. Accordingly, the block diagrams and flowchart illustrations support various combinations of embodiments for performing the specified instructions, operations, or steps.

II. EXAMPLE FRAMEWORK

FIG. 1 depicts a block diagram of an example architecture 100 in accordance with some embodiments of the present disclosure. The architecture 100 comprises a computing system 101 configured to receive a request, such as a query, and/or the like, from client computing entities 102, process the request, and provide generative outputs to the client computing entities 102. The example architecture 100 may be used in a plurality of domains and not limited to any specific application as disclosed herewith. The plurality of domains may comprise healthcare, industrial, manufacturing, computer security, and/or the like to name a few.

In accordance with various embodiments of the present disclosure, one or more machine learned models may be trained to generate candidate outputs, candidate output scores, and/or other machine learned outputs. The models may be adapted to RAG pipeline that may collectively process a request to generate an output. Some techniques of the present disclosure may adapt traditional models to an enhanced framework for more accurately handling portions of the generative process, for example, by reducing hallucinations and managing data staleness.

In some embodiments, the computing system 101 may communicate with at least one of the client computing entities 102 using one or more communication networks. Examples of communication networks comprise any wired or wireless communication network including, for example, a wired or wireless local area network (LAN), personal area network (PAN), metropolitan area network (MAN), wide area network (WAN), or the like, as well as any hardware, software, and/or firmware required to implement it (such as, e.g., network routers, and/or the like).

The computing system 101 may comprise a predictive computing entity 106 and one or more external computing entities 108. The predictive computing entity 106 and/or one or more external computing entities 108 may be individually and/or collectively configured to receive requests from client computing entities 102, process the requests to generate a code predictions, and provide the code predictions to the client computing entities 102.

For example, as discussed in further detail herein, the predictive computing entity 106 and/or one or more external computing entities 108 comprise storage subsystems that may be configured to store input data, training data, and/or the like that may be used by the respective computing entities to perform predictive data analysis and/or training operations of the present disclosure. In addition, the storage subsystems may be configured to store model definition data used by the respective computing entities to perform various predictive data processing and/or training tasks. The storage subsystem may comprise one or more storage units, such as multiple distributed storage units that are connected through a computer network. A storage unit in the respective computing entities may store at least one of one or more data assets and/or a set of data about the computed properties of one or more data assets. Moreover, each storage unit in the storage systems may comprise one or more non-volatile storage or volatile storage media similar to or different than the non-volatile and/or volatile computer-readable storage media discussed above.

In some embodiments, the predictive computing entity 106 and/or one or more external computing entities 108 are communicatively coupled using one or more wired and/or wireless communication techniques. The respective computing entities may be configured according to the techniques described herein to perform one or more operations of one or more techniques described herein. By way of example, the predictive computing entity 106 may be configured to train, implement, use (e.g., execute an inference operation(s)), update (e.g., fine-tune), and evaluate machine learning models in accordance with one or more training and/or inference operations of the present disclosure. In some examples, the external computing entities 108 may be configured to train, implement, use, update, and evaluate machine learning models in accordance with one or more training and/or inference operations of the present disclosure.

In some example embodiments, the predictive computing entity 106 may be configured to receive and/or transmit one or more datasets, objects, and/or the like from and/or to the external computing entities 108 to perform one or more steps/operations of one or more techniques (e.g., query processing, generative techniques) described herein. The external computing entities 108, for example, may comprise and/or be associated with one or more entities that may be configured to receive, transmit, store, manage, and/or facilitate datasets, and/or the like. The external computing entities 108, for example, may comprise data sources that may provide such datasets, and/or the like to the predictive computing entity 106 which may leverage the datasets, such as the RAG datastore, to perform one or more steps/operations of the present disclosure, as described herein. In some examples, the datasets may comprise an aggregation of data from across a plurality of external computing entities 108 into one or more aggregated datasets. The external computing entities 108, for example, may be associated with one or more data repositories, cloud platforms, compute nodes, organizations, and/or the like, which may be individually and/or collectively leveraged by the predictive computing entity 106 to obtain and aggregate data for an information domain.

In some example embodiments, the predictive computing entity 106 may be configured to receive a trained machine learning model trained and subsequently provided by the one or more external computing entities 108. For example, the one or more external computing entities 108 may be configured to perform one or more training steps/operations of the present disclosure to train a machine learning model, as described herein. In such a case, the trained machine learning model may be provided to the predictive computing entity 106, which may leverage the trained machine learning model to perform one or more inference steps/operations of the present disclosure. In some examples, feedback (e.g., evaluation data, ground truth data) from the use of the machine learning model may be received and/or stored by the predictive computing entity 106. In some examples, the feedback may be provided to the one or more external computing entities 108 to continuously train the machine learning model over time. In some examples, the feedback may be leveraged by the predictive computing entity 106 to continuously train the machine learning model over time. In this manner, the computing system 101 may perform, via one or more combinations of computing entities, one or more prediction, training, and/or any other machine learning-based techniques of the present disclosure.

A. Example Computing Entity

Figure 2:
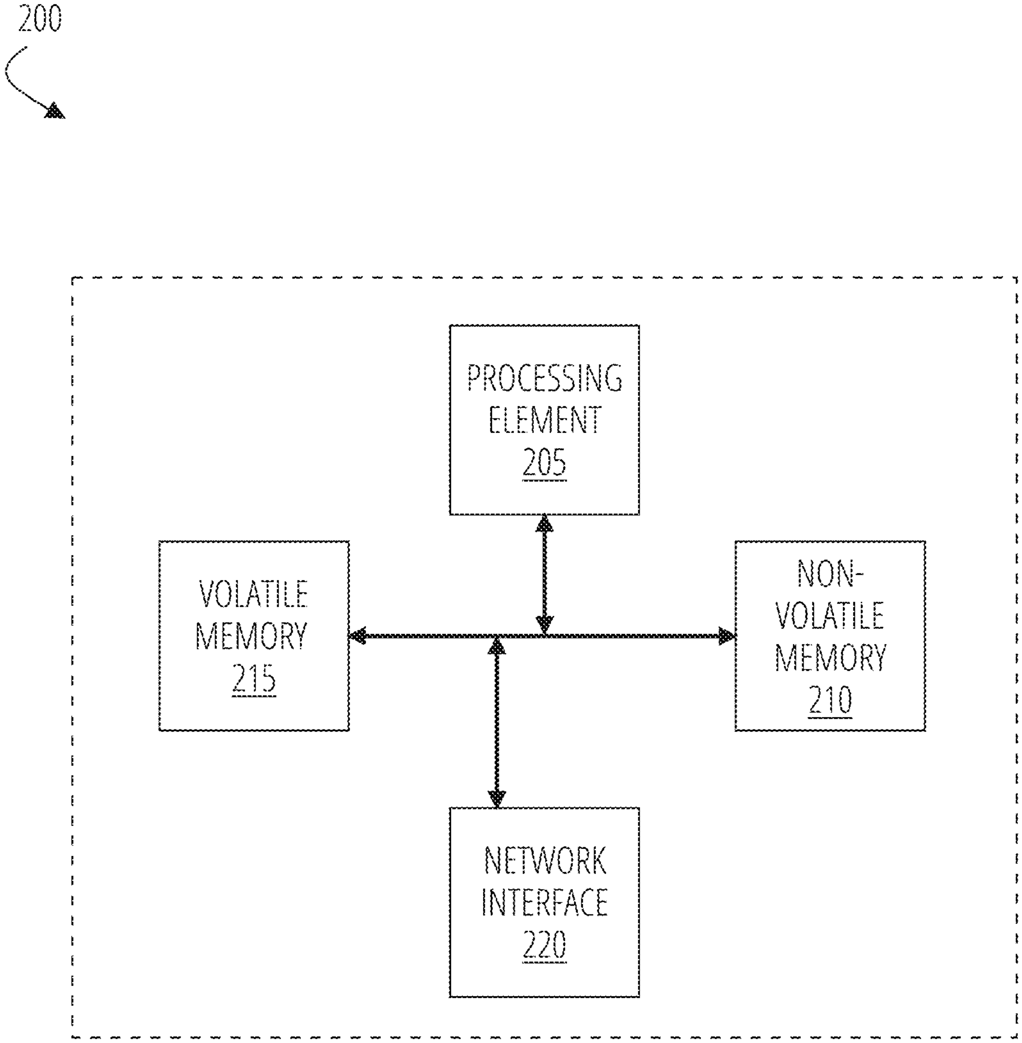
FIG. 2 is a block diagram of an example predictive data analysis computing entity in accordance with some embodiments of the present disclosure.

FIG. 2 depicts a block diagram of an example computing entity 200 in accordance with some embodiments of the present disclosure. The computing entity 200 is an example of the predictive computing entity 106 and/or external computing entities 108 of FIG. 1. In general, the terms computing entity, computer, entity, device, system, and/or similar words used herein interchangeably may refer to, for example, one or more computers, computing entities, desktops, mobile phones, tablets, phablets, notebooks, laptops, distributed systems, kiosks, input terminals, servers or server networks, blades, gateways, switches, processing devices, processing entities, set-top boxes, relays, routers, network access points, base stations, the like, and/or any combination of devices or entities adapted to perform the functions, operations, and/or processes described herein. Such functions, operations, and/or processes may comprise, for example, transmitting, receiving, operating on, processing, displaying, storing, determining, creating/generating, training one or more machine learning models, monitoring, evaluating, comparing, and/or similar terms used herein interchangeably. In some embodiments, these functions, operations, and/or processes may be performed on data, content, information, and/or similar terms used herein interchangeably. In some embodiments, the one computing entity (e.g., predictive computing entity 106) may train and use one or more machine learning models described herein. In other embodiments, a first computing entity (e.g., predictive computing entity 106, which may be one or more predictive computing entities) may use one or more machine learning models that may be trained by a second computing entity (e.g., external computing entity 108) communicatively coupled to the first computing entity. The second computing entity, for example, may train one or more of the machine learning models described herein, and subsequently provide the trained machine learning model(s) (e.g., optimized weights, code sets) to the first computing entity over a network.

As shown in FIG. 2, in some embodiments, the computing entity 200 may comprise, or be in communication with, one or more processing elements 205 (also referred to as processors, processing circuitry, and/or similar terms used herein interchangeably) that communicate with other elements within the computing entity 200 via a bus, for example. As will be understood, the processing element 205 may be embodied in a number of different ways.

For example, the processing element 205 may be embodied as one or more complex programmable logic devices (CPLDs), microprocessors, multi-core processors, arithmetic logic units (ALUs) (e.g., which may be part of one or more graphics processing units (GPUs), tensor processing units (TPUs), and/or the like), coprocessing entities, application-specific instruction-set processors (ASIPs), microcontrollers, and/or controllers. Additionally, or alternatively, the processing element 205 may be embodied as one or more other processing devices and/or circuitry. The term circuitry may refer to an entirely hardware embodiment or a combination of hardware and computer program products. Examples of a combination of hardware and computer program products comprise application specific integrated circuits (ASICs), field programmable gate arrays (FPGAs), programmable quantum gate arrays, programmable logic arrays (PLAs), hardware accelerators, other circuitry, and/or the like. With respect to quantum computing embodiments of the computing entity 200, the processing element 205 may comprise specialized components for manipulating and measuring quantum states. These components may comprise quantum gates that perform operations on one or more qubits, quantum circuits that combine multiple gates to implement algorithms, measurement devices that extract classical information from quantum state, and/or the like. The quantum gates, circuits, and/or the like may be controlled, using one or more error correction mechanisms to compensate for decoherence and other quantum noise effects, to maintain quantum coherence while performing computations.

As will therefore be understood, the processing element 205 may be configured for a particular use or configured to execute instructions stored in volatile or non-volatile media or otherwise accessible to the processing element 205. As such, whether configured by hardware or computer program products, or by a combination thereof, the processing element 205 may be capable of performing steps or operations according to embodiments of the present disclosure when configured accordingly.

In some embodiments, the computing entity 200 may further comprise, or be in communication with, non-transitory computer readable media, such as non-volatile memory 210 (also referred to as non-volatile media, storage, memory storage, memory circuitry, and/or similar terms used herein interchangeably), volatile memory 215 (also referred to as volatile media, storage, memory storage, memory circuitry, and/or similar terms used herein interchangeably), quantum memory (e.g., solid quantum memory, atomic gas quantum memory), and/or the like.

In some embodiments, non-volatile memory 210 may comprise a computer-readable storage medium may comprise a floppy disk, flexible disk, hard disk, solid-state storage (SSS) (e.g., a solid-state drive (SSD), solid-state card (SSC), solid-state module (SSM)), enterprise flash drive, magnetic tape, or any other non-transitory magnetic medium, and/or the like. A non-volatile computer-readable storage medium may also comprise a punch card, paper tape, optical mark sheet (or any other physical medium with patterns of holes or other optically recognizable indicia), compact disc read only memory (CD-ROM), compact disc-rewritable (CD-RW), digital versatile disc (DVD), Blu-ray disc (BD), any other non-transitory optical medium, and/or the like. Such a non-volatile computer-readable storage medium may also comprise read-only memory (ROM), programmable read-only memory (PROM), erasable programmable read-only memory (EPROM), electrically erasable programmable read-only memory (EEPROM), flash memory (e.g., Serial, NAND, NOR, and/or the like), multimedia memory cards (MMC), secure digital (SD) memory cards, SmartMedia cards, CompactFlash (CF) cards, Memory Sticks, and/or the like. Further, a non-volatile computer-readable storage medium may also comprise conductive-bridging random access memory (CBRAM), phase-change random access memory (PRAM), ferroelectric random-access memory (FeRAM), non-volatile random-access memory (NVRAM), magnetoresistive random-access memory (MRAM), resistive random-access memory (RRAM), Silicon-Oxide-Nitride-Oxide-Silicon memory (SONOS), floating junction gate random access memory (FJG RAM), Millipede memory, racetrack memory, and/or the like.

In some embodiments, volatile memory 215 may comprise a computer-readable storage medium including random access memory (RAM), dynamic random access memory (DRAM), static random access memory (SRAM), fast page mode dynamic random access memory (FPM DRAM), extended data-out dynamic random access memory (EDO DRAM), synchronous dynamic random access memory (SDRAM), double data rate synchronous dynamic random access memory (DDR SDRAM), double data rate type two synchronous dynamic random access memory (DDR2 SDRAM), double data rate type three synchronous dynamic random access memory (DDR3 SDRAM), Rambus dynamic random access memory (RDRAM), Twin Transistor RAM (TTRAM), Thyristor RAM (T-RAM), Zero-capacitor (Z-RAM), Rambus in-line memory module (RIMM), dual in-line memory module (DIMM), single in-line memory module (SIMM), video random access memory (VRAM), cache memory (including various levels), flash memory, register memory, and/or the like. It will be appreciated that where embodiments are described to use a computer-readable storage medium, other types of computer-readable storage media may be substituted for or used in addition to the computer-readable storage media described above.

In some embodiments, quantum memory comprises a memory structure that utilize quantum bits, or qubits, which may exist in multiple states simultaneously through a property called superposition. Unlike classical bits that may only be in a state of 0 or 1, qubits may represent both states at once, allowing for exponentially larger information storage capacity. These quantum memory structures must maintain quantum coherence, which refers to the delicate quantum mechanical state of the system, while also allowing for rapid access and manipulation of stored quantum information.

As will be recognized, the non-volatile memory 210, the volatile memory 215, and/or the quantum memory may store respective part(s) of one or more databases, database instances, database management systems, data, applications, programs, program modules, scripts, code (e.g., source code, object code, byte code, compiled code, interpreted code, machine code) that embodies one or more machine learning models or other computer functions described herein, executable instructions, and/or the like being executed by, for example, the processing element 205. The term database, database instance, database management system, and/or similar terms used herein interchangeably, may refer to a collection of records or data that is stored in a computer-readable storage medium using one or more database models; such as a hierarchical database model, network model, relational model, entity-relationship model, object model, document model, semantic model, graph model, and/or the like.

Thus, the databases, database instances, database management systems, data, applications, programs, program modules, code (source code, object code, byte code, compiled code, interpreted code, machine code) that embodies one or more machine learning models or other computer functions described herein, executable instructions, and/or the like may be used to control certain aspects of the operation of the computing entity 200 by operating the processing element 205 according to software component(s)

retrieved from any of the computer-readable storage media and executed by the processing element 205.

Embodiments of the present disclosure may be implemented in various ways, including as computer program products that comprise articles of manufacture. Such computer program products may comprise one or more software components including, for example, software objects, methods, data structures, or the like. A software component may be coded in any of a variety of programming languages. An illustrative programming language may be a lower-level programming language such as an assembly language associated with a particular hardware architecture and/or operating system platform. A software component comprising assembly language instructions may require conversion into executable machine code by an assembler prior to execution by the hardware architecture and/or platform. Another example programming language may be a higher-level programming language that may be portable across multiple architectures. A software component comprising higher-level programming language instructions may require conversion to an intermediate representation by an interpreter or a compiler prior to execution.

Other examples of programming languages comprise, but are not limited to, a macro language, a shell or command language, a job control language, a script language, a database query or search language, and/or a report writing language. In one or more example embodiments, a software component comprising instructions in one of the foregoing examples of programming languages may be executed directly by an operating system or other software component without having to be first transformed into another form, such as object code, or may be first transformed into another form, such as by compiling source code. A software component may be stored as a file or other data storage construct. Software components of a similar type or functionally related may be stored together such as, for example, in a particular directory, folder, or library. Software components may be static (e.g., pre-established, or fixed) or dynamic (e.g., created or modified at the time of execution).

A computer program product may comprise a non-transitory computer-readable storage medium storing one or more software components comprising application(s), program(s), program module(s), script(s), source code and/or compiler(s) for generating executable instructions such as object code using the source code, program code, object code, byte code, compiled code, interpreted code, machine code, executable instructions, and/or the like (e.g., executable instructions, instructions for execution, computer program products, program code, and/or similar terms used herein interchangeably). Such non-transitory computer-readable storage media comprise all computer-readable storage media (including volatile memory 215 and non-volatile memory 210). In some embodiments, the computer program product may be executed by the computing entity 200 and/or the client computing entity. For example, at least a first portion of the computer program product may be stored within the volatile memory 215 and/or non-volatile 210 of the computing entity 200. In addition, or alternatively, at least a second portion of the computer program product may be stored within the volatile and/or non-volatile memory of a client computing entity.

In some embodiments, one or more embodiments of the present disclosure may be implemented using general and/or specialized quantum computers. For example, the computing entity 200 may comprise quantum memory and/or quantum processing elements, as described herein, that may be configured for general processing and/or specialized processing tasks. In some examples, the quantum memory and/or quantum processing elements of the computer entity 200 may be specialized for machine learning task. By way of example, large language models (LLMs) and other transformer networks may be specially designed for operation within a quantum environment by replacing weight matrices in self-attention and/or multi-layer perceptron layers of such models with one or more combinations of two variational quantum circuits and/or a quantum-inspired tensor networks, such as a matrix product operator (MPO). In this way, LLM functionality may be enabled within a quantum environment by decomposing weight matrices through the application of tensor network disentanglers and MPOs. Similarly, quantum support vector machines, quantum neural networks, and/or any other machine learning architecture may be modified to a quantum environment for implementation by the computing entity 200. Thus, the machine learning architectures of the present disclosure may be configured for classical computer or quantum computers based on the embodiment.

As indicated, in some embodiments, the computing entity 200 may also comprise one or more network interfaces 220 for communicating with various computing entities (e.g., the client computing entity 102, external computing entities), such as by communicating data, code, content, information, and/or similar terms used herein interchangeably that may be transmitted, received, operated on, processed, displayed, stored, and/or the like. Such communication may be executed using a wired data transmission protocol, such as fiber distributed data interface (FDDI), digital subscriber line (DSL), Ethernet, asynchronous transfer mode (ATM), frame relay, data over cable service interface specification (DOCSIS), or any other wired transmission protocol. In some embodiments, the computing entity 200 communicates with another computing entity for uploading or downloading data or code (e.g., data or code that embodies or is otherwise associated with one or more machine learning models). Similarly, the computing entity 200 may be configured to communicate via wireless external communication networks using any of a variety of protocols, such as general packet radio service (GPRS), Universal Mobile Telecommunications System (UMTS), Code Division Multiple Access 2000 (CDMA2000), CDMA2000 1× (1×RTT), Wideband Code Division Multiple Access (WCDMA), Global System for Mobile Communications (GSM), Enhanced Data rates for GSM Evolution (EDGE), Time Division-Synchronous Code Division Multiple Access (TD-SCDMA), Long Term Evolution (LTE), Evolved Universal Terrestrial Radio Access Network (E-UTRAN), Evolution-Data Optimized (EVDO), High Speed Packet Access (HSPA), High-Speed Downlink Packet Access (HSDPA), IEEE 802.11 (Wi-Fi), Wi-Fi Direct, IEEE 802.16 (WiMAX), ultra-wideband (UWB), infrared (IR) protocols, near field communication (NFC) protocols, Wibree, Bluetooth protocols, wireless universal serial bus (USB) protocols, and/or any other wireless protocol.

Although not shown, the computing entity 200 may additionally or alternatively comprise, or be in communication with, one or more input elements/devices, such as input sensor(s). In some examples, the input sensor(s) may comprise one or more keyboards, pointing devices (e.g., mouse, trackpad), touch screens, cameras (e.g., infrared light camera, visual light camera), depth sensors (e.g., LIDAR, radar, stereo cameras), gyroscopes, location sensors (e.g., global positioning system (GPS), Hall effect sensor, laser doppler vibrometer), microphones, and/or the like. The computing entity 200 may additionally or alternatively comprise, or be in communication with, one or more output elements/devices (not shown), such as one or more speakers, visual display devices, haptic feedback devices, motion devices (e.g., electromechanically actuated devices), and/or the like.

B. Example Client Computing Entity

Figure 3:
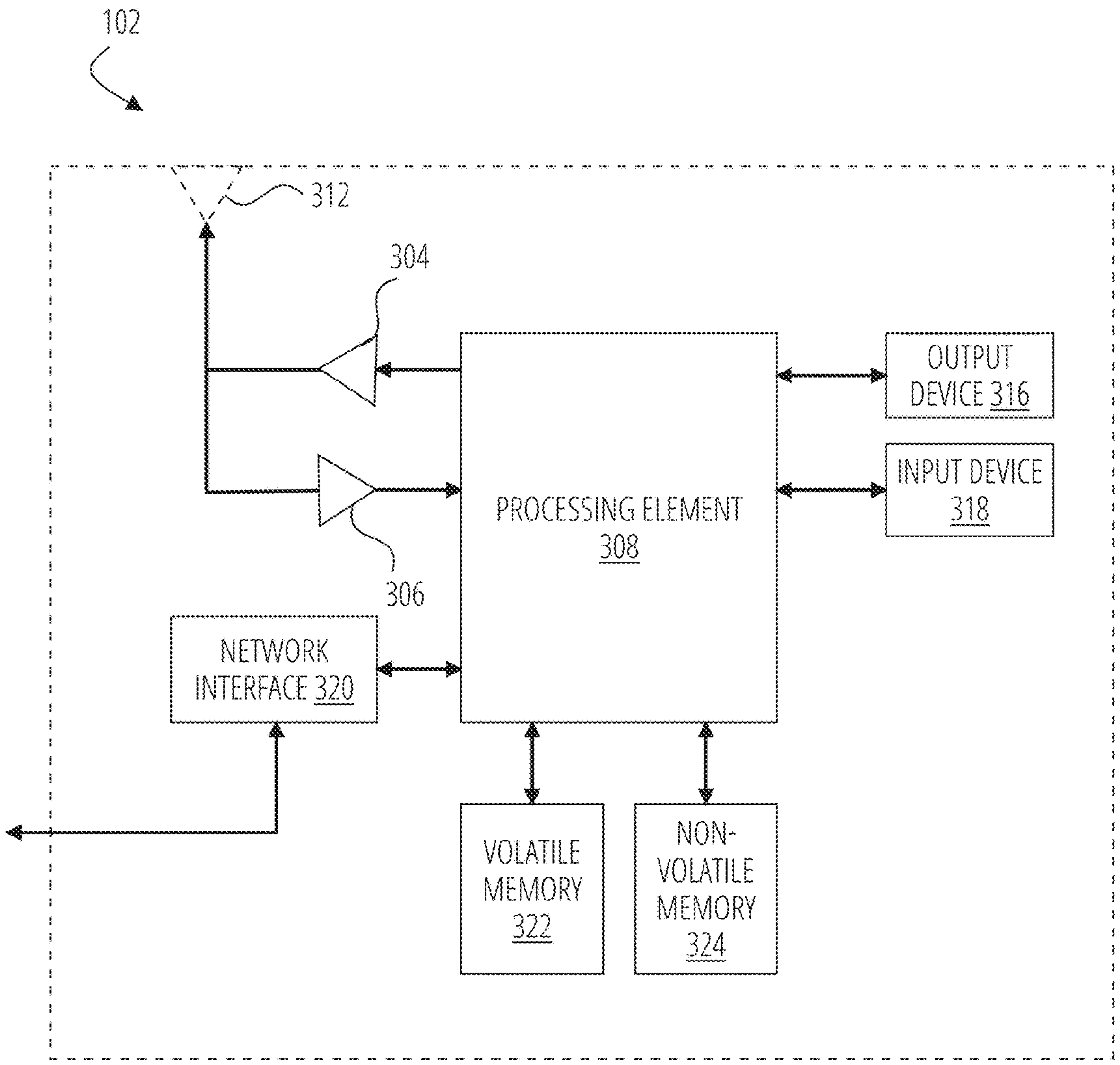
FIG. 3 is a block diagram of an example client computing entity in accordance with some embodiments of the present disclosure.

FIG. 3 depicts a block diagram of an example client computing entity in accordance with some embodiments of the present disclosure. In general, the terms device, system, computing entity, entity, and/or similar words used herein interchangeably may refer to, for example, one or more computers, computing entities, desktops, mobile phones, tablets, phablets, notebooks, laptops, distributed systems, kiosks, input terminals, servers or server networks, blades, gateways, switches, processing devices, processing entities, set-top boxes, relays, routers, network access points, base stations, the like, and/or any combination of devices or entities adapted to perform the functions, operations, and/or processes described herein. Client computing entities 102 may be operated by various parties. As shown in FIG. 3, the client computing entity 102 may comprise an antenna 312, a transmitter 304 (e.g., radio), a receiver 306 (e.g., radio), and a processing element 308 (e.g., CPLDs, microprocessors, multi-core processors, coprocessing entities, ASIPs, microcontrollers, and/or controllers) that provides signals to and receives signals from the transmitter 304 and receiver 306, correspondingly.

The signals provided to and received from the transmitter 304 and the receiver 306, correspondingly, may comprise signaling information/data in accordance with air interface standards of applicable wireless systems. In this regard, the client computing entity 102 may be capable of operating with one or more air interface standards, communication protocols, modulation types, and access types. More particularly, the client computing entity 102 may operate in accordance with one or more wireless and/or wired communication standards and protocols, such as those described above with regard to the computing entity 200.

The client computing entity 102 may additionally or alternatively download code, changes, add-ons, and updates, for instance, to its firmware, software (e.g., including executable instructions, applications, program modules), and operating system.

According to some embodiments, the client computing entity 102 may comprise location determining aspects, devices, modules, functionalities, and/or similar words used herein interchangeably. For example, the client computing entity 102 may comprise outdoor positioning aspects, such as a location component adapted to acquire, for example, latitude, longitude, altitude, geocode, course, direction, heading, speed, universal time (UTC), date, and/or various other information/data. In some embodiments, the location component may acquire data, sometimes known as ephemeris data, by identifying the number of satellites in view and the relative positions of those satellites (e.g., using global positioning systems (GPS)). The satellites may be a variety of different satellites, including Low Earth Orbit (LEO) satellite systems, Department of Defense (DOD) satellite systems, the European Union Galileo positioning systems, the Chinese Compass navigation systems, Indian Regional Navigational satellite systems, and/or the like. This data may be collected using a variety of coordinate systems, such as the Decimal Degrees (DD); Degrees, Minutes, Seconds (DMS); Universal Transverse Mercator (UTM); Universal Polar Stereographic (UPS) coordinate systems; and/or the like. Alternatively, the location information/data may be determined by triangulating the position of the client computing entity 102 in connection with a variety of other systems, including cellular towers, Wi-Fi access points, and/or the like. Similarly, the client computing entity 102 may comprise indoor positioning aspects, such as a location component adapted to acquire, for example, latitude, longitude, altitude, geocode, course, direction, heading, speed, time, date, and/or various other information/data. Some of the indoor systems may use various position or location technologies including RFID tags, indoor beacons or transmitters, Wi-Fi access points, cellular towers, nearby computing devices (e.g., smartphones, laptops), and/or the like. For instance, such technologies may comprise the iBeacons, Gimbal proximity beacons, Bluetooth Low Energy (BLE) transmitters, NFC transmitters, and/or the like. These indoor positioning aspects may be used in a variety of settings to determine the location of someone or something to within inches or centimeters.

The client computing entity 102 may also comprise a user interface that may comprise an output device 316 coupled to a processing element 308 and/or a user input device 318 coupled to the processing element 308. An output device 316, for example, may comprise a hardware computing device comprising one or more output elements (not shown), such as one or more speakers, visual display devices, haptic feedback devices, motion devices (e.g., electromechanically actuated devices), and/or the like. A user input device 318 may comprise the same or different hardware computing device comprising one or more input elements (not shown), such as keyboards, pointing devices (e.g., mouse, trackpad), touch screens, cameras (e.g., infrared light camera, visual light camera), depth sensors (e.g., LIDAR, radar, stereo cameras), gyroscopes, location sensors (e.g., global positioning system (GPS), Hall effect sensor, laser doppler vibrometer), microphones, and/or the like.

In some examples, the user interface may additionally or alternatively comprise software component(s) executed by the processing element 308 to present (e.g., audibly, visually, tactilely) via a user input device 318 and/or output device 316 and/or a software endpoint such as an application programming interface (API) or exposed software function a graphical user interface (GUI) (e.g., at least a portion of a user application, browser), command-line interface, touch and/or haptic user interface, gesture and/or image capture-based interface, voice/audio user interface, and/or the like used herein interchangeably executing on and/or accessible via the client computing entity 102 to interact with and/or cause display of information/data from the computing entity 200, as described herein. In addition to providing input, the user input interface may be used, for example, to activate, deactivate, and/or modify certain functions, such as altering a power or operating state of the client computing entity 102, the computing system 101, the predictive computing entity 106, and/or the external computing entity 108.

The client computing entity 102 may further comprise, or be in communication with, one or more memory components, such as the volatile memory 322 and/or non-volatile memory 324. For example, the memory components may comprise non-transitory computer readable media, such as non-volatile memory 324 (also referred to as non-volatile storage, memory, memory storage, memory circuitry, and/or similar terms used herein interchangeably) and/or volatile memory 322 (also referred to as volatile storage, memory, memory storage, memory circuitry, and/or similar terms used herein interchangeably), as discussed above with reference to FIG. 2.

As will be recognized, the non-volatile memory 324 and/or the volatile memory 322 may store respective part(s) of one or more databases, database instances, database management systems, data, applications, programs, program modules, scripts, code (e.g., source code, object code, byte code, compiled code, interpreted code, machine code) that embodies one or more machine learning models or other computer functions described herein, executable instructions, and/or the like being executed by, for example, the processing element 308. The term database, database instance, database management system, and/or similar terms used herein interchangeably, may refer to a collection of records or data that is stored in a computer-readable storage medium using one or more database models; such as a hierarchical database model, network model, relational model, entity-relationship model, object model, document model, semantic model, graph model, and/or the like.

In another embodiment, the client computing entity 102 may comprise one or more components or functionalities that are the same or similar to those of the computing entity 200, as described in greater detail above. In one such embodiment, the client computing entity 102 downloads, e.g., via network interface 320, code embodying machine learning model(s) from the computing entity 200 so that the client computing entity 102 may run a local instance of the machine learning model(s). As will be recognized, these architectures and descriptions are provided for example purposes only and are not limited to the various embodiments.

In various embodiments, the client computing entity 102 may be embodied as an artificial intelligence (AI) computing entity (e.g., an intelligent agent machine-learned model), such as AutoGPT, Mycroft, Rhasspy, and/or the like. Accordingly, the client computing entity 102 may be configured to provide and/or receive information/data from a user via an input/output mechanism, such as a display, a camera, a speaker, a voice-activated input, and/or the like. In certain embodiments, an AI computing entity may comprise one or more predefined and executable program algorithms stored within an onboard memory storage component, and/or accessible over a network. In various embodiments, the AI computing entity may be configured to retrieve and/or execute one or more of the predefined program algorithms upon the occurrence of a predefined trigger event.

III. EXAMPLE SYSTEM OPERATIONS

As indicated, various embodiments of the present disclosure make important technical contributions to computer functionality, such as improvements to the accuracy of the generative models implemented within computer systems. In particular, systems and methods are disclosed herein that implement instruction finetuning techniques to improve data retrieval, storage, and generative operations in a RAG framework. By doing so, the instruction finetuning techniques of the present disclosure enable improved generative model pipelines that, when executed on a computer, improves the performance of generative models in various context. This, in turn, may improve the functionality of a computer with respect to various computing tasks, including data security, robotics (e.g., artificially intelligent robotic systems), network communication, and the like.

Figure 4:
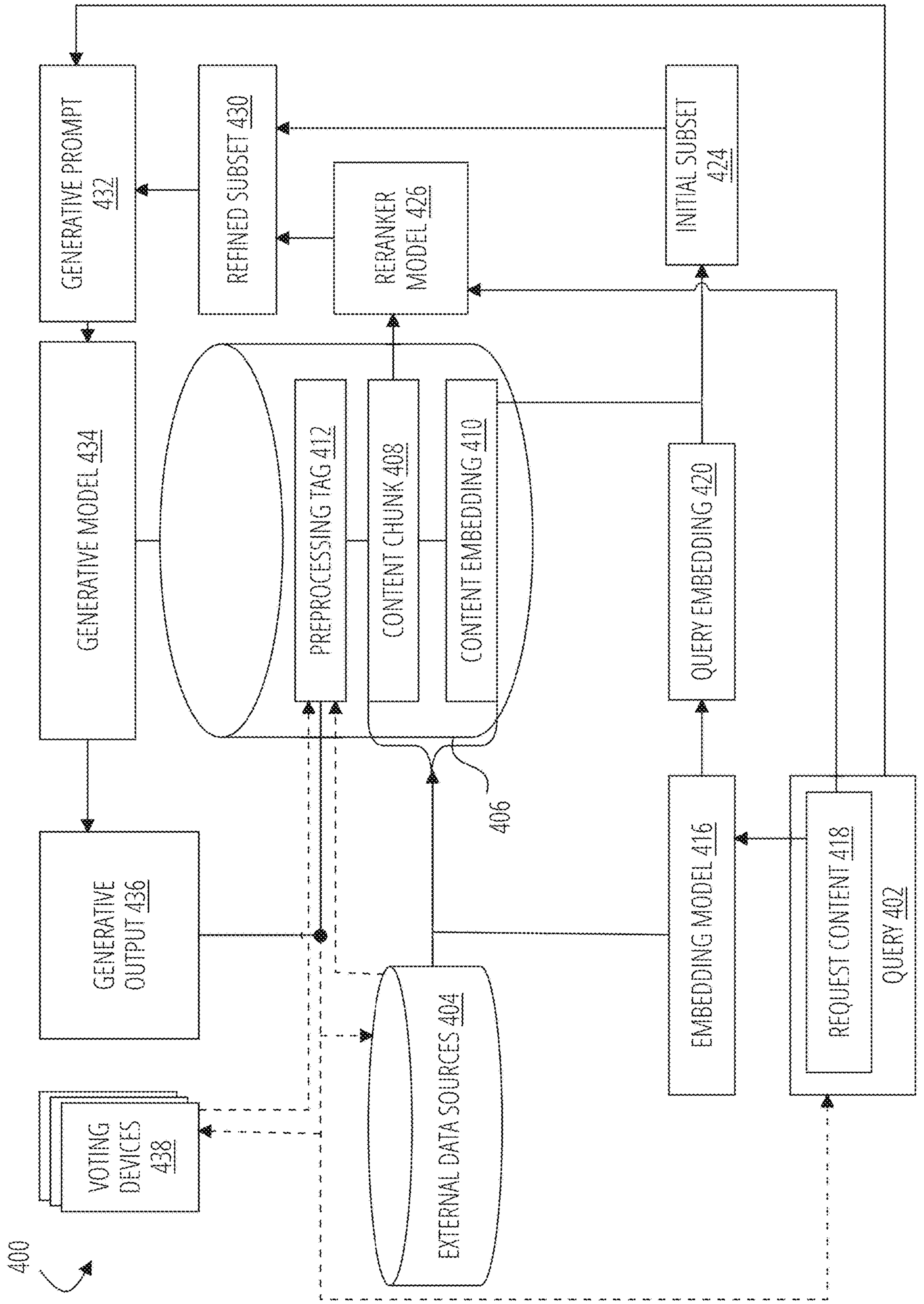
FIG. 4 is a dataflow diagram of a feedback integrated RAG framework in accordance with some embodiments of the present disclosure.

FIG. 4 is a dataflow diagram of a feedback integrated RAG framework 400 in accordance with some embodiments of the present disclosure. The feedback integrated RAG framework 400 may be implemented by a computing system, such as the computing system 101, to refine a generative output 436 through improved instruction finetuning techniques that address hallucinations, data staleness, and other technical challenges with generative models 434. To do so, the feedback integrated RAG framework 400 may integrate feedback mechanisms within a RAG pipeline that are designed to monitor an accuracy, sufficiency, and reliability of contextual data within a RAG datastore 406. For instance, the feedback mechanisms may leverage voting (e.g., a confirmation tag feedback scheme as described with reference to FIG. 5) and/or source verification (e.g., a verification tag feedback scheme as described with reference to FIG. 6) mechanisms to validate an accuracy and/or staleness of content chunks, and/or generative outputs based thereon, over time. This allows the feedback integrated RAG framework 400 to incrementally confirm portions of a RAG datastore 406 over time and with use. Using the voting mechanism, for example, the feedback integrated RAG framework 400 may incrementally confirm content chunks for use in constraining generative outputs 436 to reduce hallucinations using independently validated information. In addition, or alternatively, using the source verification mechanism, external data sources 404 may periodically reverify content chunks for use in constraining generative outputs 436 to reduce data staleness using information from up to date data sources. In this way, the feedback integrated RAG framework 400 provides improved instruction finetuning techniques that enhance the accuracy and oversight of information within a RAG datastore 406. This allows the computing system 101 to generate generative prompts 432 with more accurate and reliable contextual data, which, in turn, may improve the performance (e.g., in terms of accuracy) of generative models.

In some embodiments, the computing system 101 receives a query 402 comprising request content 418 for a generative model 434. The query 402, for example, may comprise a request message that requests a generative output 436 in response to request content 418. In some examples, the query 402 may comprise a text-, image-, and/or audio-based content (e.g., question and/or context) and/or one or more contextual attributes, such as a request identifier, a model identifier for a generative model 434, a datastore identifier for a RAG datastore 406 corresponding to the generative model 434, requestor identifier, a priority level, and/or the like. By way of example, the query 402 may comprise a structured data object, such as a SQL query, an API call, gRPC call, and/or the like that identifies request content 418 and/or one or more contextual attributes for the request content 418.

In some embodiments, the request content 418 the text-, image-, and/or audio-based content within a query 402. The request content 418, for example, may comprise a representation of at least one of a question and/or a context for the question. In some examples, the question may comprise a factual question that may correspond to a verifiable fact. In addition, or alternatively, the question may comprise a procedural question that may correspond to one or more defined guideline maintained by a set of authoritative entities (e.g., clinical best practice guidelines, prior authorization guidelines, computer security guidelines). In some examples, the request content 418 is domain specific. For instance, in a clinical domain, the request content 418 may represent a procedural question for assessing a coordination of benefits scenario that is outlined within the context of the request content 418. As another example, the request content 418 may represent computer security question for assessing a security risk based on a scenario outlined within the context of the request content 418.

In any domain, the request content 418 may comprise the basis for generating a generative output 436 using a generative model 434. To do so, the request content 418 may be preprocessed by an embedding model 416 to generate a query embedding 420 that may tokenize, vectorize, or embedded the request content 418 to create a machine-readable format that may be efficiently processed by downstream models within the feedback integrated RAG framework 400. As described further herein, different content formats of the request content 418 may be facilitated by routing the request content 418 to one or more different embedding models 416. A text-based embedding model, such as bidirectional encoder representations from transformers (BERT), sentence to transformers, and/or the like, may be applied to a text-based request content 418. An image-based embedding model, such as a convolutional neural network, and/or the like, may be applied to an image-based request content 418. An audio-based embedding model, such as wax2vec, and/or the like, may be applied to an audio-based request content 418.

In some embodiments, the generative model 434 to a machine learning model, such as transformer-based model trained to interpret a prompt, such as the generative prompts 432 of the present disclosure, and/or output generative outputs 436 based on the prompts. The generative model 434, for example, may comprise a neural network with a transformer architecture, such as BERT, Language Model for Dialogue Applications (LaMDA), generative pre-trained transformers (GPT), and/or the like. In some examples, the generative model 434 may comprise a domain-agnostic generative model 434, such as an finetuned foundation model, and/or a domain-specific generative model 434 that may be finetuned on a domain-specific dataset, such as the RAG datastore 406 described herein. In addition, or alternatively, the generative model 434 may be finetuned for specific tasks, such as data summarization, translation, question-answering, and/or the like.

In some embodiments, the computing system 101 generates, using an embedding model 416, a query embedding 420 for the query 402 by embedding the request content 418. In some examples, the embedding model 416 may comprise a distinct model from the generative model 434. In addition, or alternatively, the embedding model 416 may comprise a portion (e.g., an embedding layer) of the generative model 434 (e.g., comprising an embedding and decoding layer). The embedding model 416 may comprise any vectorization technique for transforming text-, image-, and/or audio-content into a dense vector representation.

In some examples, the embedding model 416 may comprise a neural network, such as an encoder-only transformer, convolutional neural network, recurrent neural network, and/or the like, designed to map high-dimensional data (e.g., text, images, audio) into a lower-dimensional vector space while preserving semantic and/or spatial relationships. In text-based example, the embedding model 416 may comprise transformer architecture, such as an encoder-only BERT model, which may be trained on large corpora of text to learn contextual representations of words and phrases.

In any domain, the embedding model 416 enables a semantic-based retrieval process when the same embedding model 416 is used to embed both the request content 418 and a set of data, such as the content chunks 408 described herein, within a RAG datastore 406. For example, the embedding model 416 may be used to generate vector representations (e.g., query embeddings 420, content embeddings 410) of both the content chunks 408 stored in the RAG datastore 406 and/or the request content 418 of a query 402. These embeddings enable efficient similarity searches, allowing the computing system 101 to identify relevant content for a given query 402.

In some embodiments, the query embedding 420 comprises a fixed-sized vector output from the embedding model 416 that captures the sematic properties of an input request content 418. The fixed-sized vector, for example, may comprise a dense, numerical representation of the query's semantic content in a high-dimensional space.

In some embodiments, the computing system 101 receives, from a RAG datastore 406, a content chunk 408 based on the query embedding 420 and a content embedding 410 of the content chunk 408. The RAG datastore 406, for example, may comprise a set of content chunks, including the content chunk 408. The computing system 101 may determine an embedding similarity score between the query embedding 420 and/or the content embedding 410. The computing system 101 may receive the content chunk 408 from the RAG datastore 406 based on the embedding similarity score. For instance, the computing system 101 may receive the content chunk 408 in response to the embedding similarity score meeting and/or exceeding a similarity threshold (e.g., a preset threshold, a relative threshold, such as the highest similarity score relative to the set of content chunks).

More particularly, in some embodiments, the RAG datastore 406 comprises a data structure that stores a set of content chunks 408 for a particular domain. The RAG datastore 406, and/or the content chunks 408 therein, may provide a knowledge base from which relevant information is retrieved to augment a generative process. The RAG datastore 406 may comprise any data storage device, such as one or more relational databases, graph data structures, vector databases, and/or the like.

In some embodiments, the RAG datastore 406 stores a set of content chunks 408 in association (e.g., via references, common storage locations, graph edges) with a set of content embeddings 410 and/or preprocessing tags 412. The RAG datastore 406, for example, may comprise an index structure, such as an inverted file index, a hierarchical navigable small world (HNSW) graph, and/or the like, to enable fast approximate nearest neighbor search. In some examples, the RAG datastore 406 may comprise a metadata storage for additional information about each content chunk 408, such as a content embedding 410 and/or preprocessing tag 412.

In some embodiments, the content chunk 408 comprises a piece of content (e.g., a sentence, paragraph, section, image bounding box, audio snippet) that may be relevant to a particular domain and/or may provide information for resolving a query 402. A content chunk 408, for example, may form a basic unit of information stored in the RAG datastore 406. In some examples, the content chunk 408 may be chunked, using one or more chunking algorithms (e.g., fixed-size chunking, context-aware chunking, sentence splitting, recursive chunking, semantic chunking), segmentation algorithms (e.g., region-based segmentation, cluster-base segmentation), and/or the like, from one or more ingested data objects, such as long form documents, images, audio files, and/or the like.

By way of example, the content chunks 408 may be ingested to the RAG datastore 406 from a set of data object maintained by one or more external data sources 404. The set of data object may depend on the domain. For example, in a clinical domain, the set of data objects may comprise one or more coordination of benefits-related documents, such as work instructions, standard operating procedures, job aids, patient call scripts, governance materials, and/or the like. As another example, in a computer security domain, the set of data objects may comprise one or more security profiling documents, such as historical virus scans, virus descriptions, simple network management protocols, role-based access control procedures, remote access policies, and/or the like.

In any domain, a content chunk 408 may comprise a data structure that comprise text-, image-, and/or audio-content. Up to each content chunk 408 may be associated with (e.g., via one or more references, edges) metadata, such as a content embedding 410 corresponding to the text-, image-, and/or audio-content and/or one or more preprocessing tags 412. In some examples, the text-, image-, and/or audio-content, and/or metadata associated therewith, may be stored as one or more structured objects (e.g., a JSON object, graph node) within the RAG datastore 406.

In some embodiments, the content chunks 408 comprise one or more different chunk types. The chunk types, for example, may comprise a procedural content chunk and/or a factual content chunk. The content chunk type of the content chunk 408 may be based on a source of truth for the information conveyed by the content chunk 408. By way of example, a procedural content chunk may comprise a piece of content that is relevant to a procedure within a domain, such as guidelines defined by subject matter experts. Such chunks may comprise step-by-step instructions, best practices, standardized procedures, and/or the like for which a source of truth may be a subject matter expert within the domain. As another example, a factual content chunk may comprise a piece of content that records a verifiable fact within a domain. Such chunks may comprise objective information, data points, and/or statements for which a source of truth may be an external data source 404 that manages the information.

The content chunks 408 of any type may be stored within the RAG datastore 406 in association with a content embedding 410. In some embodiments, the content embedding 410 comprises a fixed-sized vector output from the embedding model 416 that captures the sematic properties of a content chunk 408. The fixed-sized vector, for example, may comprise a dense, numerical representation of the chunk's semantic content in a high-dimensional space.

In some embodiments, the computing system 101 determines, based on the embedding similarity score, an initial subset 424 of content chunks from a set of content chunks within the RAG datastore 406. The computing system 101 may determine, using a reranker model 426, a relevancy score between the request content 418 and/or the content chunk 408. In some examples, the computing system 101 may determine, based on the relevancy score, a refined subset 430 of content chunks from the initial subset 424 of content chunks. The refined subset 430 of content chunks, for example, may comprise the content chunk 408.

More particularly, in some embodiments, the computing system 101 performs a two-stage retrieval process to retrieve one or more content chunks 408 for a generative prompt 432. The first stage of the two-stage retrieval process may comprise a similarity search stage. The second stage of the two-stage retrieval process may comprise a relevancy ranking stage.

During the similarity search stage, the computing system 101 may determine an initial subset 424 of content chunks from the RAG datastore 406 based on an embedding similarity comparison between the query embedding 420 and up to each of the set of content chunks within the RAG datastore 406. By way of example, the computing system 101 may determine an embedding similarity score for up to each of the set of content chunks and received an initial subset 424 of content chunks based on the embedding similarity scores. For example, the initial subset 424 may comprise the k closest content embeddings that align (e.g., have the highest embedding similarity scores) with the query embedding 420. The parameter k, for example, may define a number of content chunks within an initial subset 424. The parameter k may be any number, such as 10-15, and/or the like. In some examples, parameter k may be based on the domain and/or may be tuned based on the performance of the generative model 434. For instance, k may be increased to improve the accuracy of the generative model 434 and/or decreased to reduce hallucinations and/or increase the succinctness in generative outputs 436.

In some embodiments, the embedding similarity score is a similarity score that is based on a comparison between the embeddings (e.g., query embedding 420 and content embedding 410) of the request content 418 and the content chunk 408. The embedding similarity score, for example, may comprise a scalar value that quantifies the similarity between two embedding vectors in the high-dimensional space. The embedding similarity score may comprise any embedding similarity measure, such as a cosine similarity score, Euclidean distance, dot product, and/or the like.

During the relevancy ranking stage, the computing system 101 may determine another subset, the refined subset 430, from the initial subset 424 based on a relevancy ranking between the content chunks within the initial subset 424 and the request content 418 of the query 402. For example, at the relevancy ranking stage, the computing system 101 may apply a reranker model 426 to the content, rather than the embeddings, of the content chunks to rank the content chunks based on their relevance to the query 402. The reranker model 426 may generate a relevancy score for up to each of the content chunks within the initial subset 424. The computing system 101 may rank the content chunks based on their relevancy scores and determine a top n (e.g., the highest relevancy scores) refined subset 430 of content chunks according to the ranking. For example, the refined subset 430 may comprise the n most relevant (e.g., having the highest relevancy scores) content chunks. The parameter n, for example, may define a number of content chunks within a refined subset 430. The parameter n may be any number, such as 4, and/or the like. In some examples, parameter n may be based on the domain and/or may be tuned based on the performance of the generative model 434. For instance, n may be increased to improve the accuracy of the generative model 434 and/or decreased to reduce hallucinations and/or increase the succinctness in generative outputs 436.

In some embodiments, the reranker model 426 is a machine learned model, such as a transformer, which is trained to determine a relevancy between pairs of content, such as the request content 418 and the content chunk 408. A reranker model 426, for example, may comprise a specialized machine learning model designed to refine and improve the relevance ranking of content chunks in information retrieval systems. In some examples, the reranker model 426 may operate as a secondary stage in a two-stage retrieval process, following an initial retrieval step that may uses embedding-based similarity search. The reranker model 426 may be implemented as a transformer architecture, which may allow it to process and compare pairs of content sequences directly, without a reliance on pre-computed embeddings. The transformer-based approach may enable the reranker model 426 to capture complex contextual relationships and nuances that may be missed by embedding models 416.

More particularly, the reranker model 426 may be deployed as a neural network model, loaded into memory and/or executed on one or more processors or GPUs. By way of example, the reranker model 426 may comprise a BERT, T5, domain-specific models trained on particular types of data, and/or the like. In some examples, the reranker model 426 may comprise multiple models in ensemble, and/or implemented as a cascade of increasingly sophisticated models to balance computational efficiency with ranking accuracy. In any architecture, the reranker model 426 may take as input the request content 418 of the query 402 and/or a content chunk 408 of the initial subset 424, and output a relevancy score for the content chunk 408. In this manner, the reranker model 426 may be used to improve the quality and/or relevance of search results in feedback integrated RAG framework 400.

In some embodiments, the relevancy score is a measure of relevance output by the reranker model 426 based on a direct comparison between the request content 418 and the content chunk 408. The relevancy score, for example, may comprise numerical value that quantifies the degree of similarity and/or relevance between a query 402 and a content chunk 408 within the initial subset 424. The relevancy score 428, for example, may comprise a real, probabilistic, and/or the like value that is determined through a series of mathematical operations performed by the reranker model 426, which may comprise attention mechanisms, feed-forward layers, normalization steps, and/or the like. In some examples, the relevancy score may comprise a floating-point number. For instance, the relevancy score may be normalized to a range such as 0 to 1, −1 to 1, and/or the like, to enable direct comparisons between up to each of the content chunks within the initial subset 424.

In some embodiments, the content chunk 408 may be assigned a preprocessing tag 412. By way of example, the preprocessing tag 412 may comprise at least one of a confirmation tag and/or a verification tag. In some examples, the set of content chunks of the RAG datastore 406 may comprise a subset of procedural content chunks and/or a subset of factual content chunks. For instance, up to each of the subset of procedural content chunks may be associated with a confirmation tag. In addition, or alternatively, up to each of the subset of factual content chunks may be associated with a verification tag.

More particularly, in some embodiments, the preprocessing tag 412 comprises class indication, such as a binary tag (e.g., two classes) and/or a categorical tag (e.g., more than two classes), that identifies an accuracy and/or reliability of the content chunk 408. In this manner, the preprocessing tag 412 may serve as a quality control mechanism within the feedback integrated RAG framework 400. The preprocessing tag 412 may be implemented as a Boolean flag, an enumerated type, and/or the like associated with up to each content chunk in the RAG datastore 406. The preprocessing tag 412 may be stored as part of the metadata of the content chunk 408, allowing for efficient filtering and processing based on the value of the preprocessing tag 412.

For instance, as described with reference to FIGS. 5-6, a preprocessing tag 412 may be assigned to up to each of the set of content chunks as the content chunks are stored and/or updated in the RAG datastore 406. Thereafter, the value of the preprocessing tag 412 may be set and/or modified through one or more feedback mechanisms configured to address hallucinations, data staleness, and other technical challenges in traditional generative processes. In this manner, the preprocessing tag 412 may ensure a quality and/or a reliability of the information within the RAG datastore 406 used to generate generative prompt 432. When retrieving content chunks for a generative prompt 432, for example, the computing system 101 may use the preprocessing tags 412 to exclude, deprioritize, and/or prioritize content chunks according to their preprocessing tags 412. In addition, or alternatively, the computing system 101 may route (e.g., to trigger additional verification processes) a generative output 436 from a generative prompt 432 according to the preprocessing tags 412 associated with the content chunks of the generative prompt 432. In this way, the preprocessing tags 412 may improve the overall accuracy and trustworthiness of generative outputs 436 by prioritizing confirmed and/or verified information and/or enabling the feedback loops to continuously confirm and verify new information as the information is incorporated to the generative process.

As described herein, the preprocessing tag 412 may comprise one of one or more different tag types. Each tag type may be associated with different feedback loop mechanism to control the accuracy and/or reliability of the information associated with the tag. For instance, a first tag type may comprise a confirmation tag. In some embodiments, the preprocessing tag 412 comprises a confirmation tag if the content chunk 408 is procedural content chunk. For example, up to each procedural content chunk within the RAG datastore 406 may be assigned a confirmation tag. The confirmation tag may be controlled using a feedback loop that is based on a threshold number of voting inputs for the content chunk 408, as described herein with reference to FIG. 5. In addition, or alternatively, a second tag type may comprise a verification tag. In some embodiments, the preprocessing tag 412 comprises a verification tag if the content chunk 408 is factual content chunk. For example, up to each factual content chunk within the RAG datastore 406 may be assigned a verification tag. The verification tag may be controlled using a feedback loop that is based on a verification timestamp, a verification time interval, and/or an external data source 404 for the content chunk 408, as described herein with reference to FIG. 6.

In some embodiments, the computing system 101 generates a generative prompt 432 for the query 402 based on the content chunks 408 of the refined subset 430. The generative prompt 432 may comprise prompt instructions, the request content 418, the content chunk 408, and/or the like. The generative prompt 432 may comprise a RAG augmented model prompt for the query 402. The generative prompt 432, for example, may comprise a structured input provided to the generative model 434 that combines the request content 418 of the query 402 with additional context and/or information to guide the model's response generation.

In some embodiments, the generative prompt 432 comprises a set of prompt instructions. The set of prompt instructions may comprise one or more text strings that define a task for the generative model 434. For example, the set of prompt instruction may request a summarization task, a question answering task, and/or the like. In addition, or alternatively, the set of prompt instructions may define an output format, tone, and/or any other attribute for a generative output 436 from the generative model 434. In some examples, the set of prompt instructions may form a prompt template of the generative prompt 432. The computing system 101 may generate the generative prompt 432 by inserting the request content 418 and/or the content chunks 408 of the refined subset 430 to the prompt template.

In some embodiments, the computing system 101 generates, using the generative model 434, a generative output 436 based on the generative prompt 432. In some embodiments, the generative output 436 is to an output of the generative model 434, which may comprise a response produced by the generative model 434 to resolve the query 402. The generative output 436, for example, may be generated through a series of computations performed by the generative model 434 that may comprise the generative model 434 taking the generative prompt 432, processing the generative prompt 432 through one or more layers of neural networks (e.g., attention mechanisms, feed-forward layers, normalization layers), and generating a content that forms the generative output 436. By way of example, content that forms the generative output 436 may comprise a sequence of tokens, which may be decoded into human-readable text, imagery, audio, and/or the like.

The form of the generative output 436 may be based on the query 402 and/or domain. For example, may comprise a question answer and/or explanation (e.g., for a question-answering query), an information summary (e.g., for a summarization query), generating creative content (e.g., for a generation query), and/or the like. In a clinical domain, the generative output 436 may comprise an answer to clinical question, such as a coordination of benefits procedure. In a computer security domain, the generative output 436 may comprise a detection of a network anomaly. In some examples, the form of the generative output 436 may be defined by the set of prompt instructions.

In some embodiments, the computing system 101 routes the generative output 436 based on the preprocessing tag 412. For example, the computing system 101 may, in response to a determination that the preprocessing tag 412 identifies at least one of a confirmed state and/or a verified state for the content chunk 408, provide the generative output 436 in response to the query 402.

In addition, or alternatively, the computing system 101, in response to a determination that the preprocessing tag 412 identifies an unconfirmed state for the content chunk 408, the computing system 101 may provide the generative output 436 and/or the content chunk 408 to a set of voting devices 438. In some embodiments, a voting device 438, which is described in further detail with reference to FIG. 5, comprises device from which an authorized entity may confirm the validity of a content chunk 408, such as a procedural content chunk. The voting devices 438, for example, may serves as the interface through which automated agents (e.g., associated with an external database, predictive action models hosted on an external server, human experts) may interact with the computing system 101 to confirm the validity of the generative output 436 and/or one or more content chunks 408 used to generate the generative output 436. By way of example, as described herein with reference to FIG. 5, the voting devices 438 may interact with the computing system 101 by providing voting inputs to confirm or deny the validity of the generative output 436 and/or up to each of the content chunks 408 within the generative prompt 432 used to generate the generative output 436.

In some examples, in response to receiving a set of voting inputs from the set of voting devices 438 that meet or exceed a threshold number of voting inputs, the computing system 101 may provide the generative output 436 in response to the query 402, store the query 402 and/or the generative output 436 within the RAG datastore 406 as a query-output content chunk, and/or modify the preprocessing tag 412 to identify a confirmed state for the content chunk 408. By way of example, the computing system 101 may concatenate the request content 418 and/or the generative output into a single content chunk, a query-output content chunk. The computing system 101 may assign a confirmation tag to the query-output content chunk and store the query-output content chunk in association with confirmation tag within the RAG datastore 406. In addition, or alternatively, the computing system 101 may generate query-output content chunk embedding, using the embedding model 416, and store the query-output content chunk embedding in association with the query-output content chunk within the RAG datastore 406.

In some examples, the computing system 101 may receive a set of voting inputs from the set of voting devices 438 that meet or exceed a threshold number of voting inputs for at least one of the content chunks 408 within the generative prompt 432. In response to the set of voting inputs, the computing system 101 may modify the confirmation tag of the content chunk 408, as described with reference to FIG. 5.

In addition, or alternatively, in response to a determination that the preprocessing tag 412 identifies an unverified state for the content chunk, the computing system 101 may provide, to at least one of the external data sources 404, a verification request to receive a verification response for the content chunk 408. In response to a determination that the verification response verifies the content chunk 408, the computing system 101 may provide the generative output 436 in response to the query 402.

In some examples, the at least one of the external data sources 404 may comprise the same or different external data source as those used to populate the RAG datastore 406. As described with reference to FIG. 6, the computing system 101 may implement a verification tag feedback scheme to continuously monitor the state of the data within the RAG datastore 406. By doing so, the computing system 101 may address data staleness challenges that reduce the performance of generative models 434 in dynamic environments.

Figure 5:
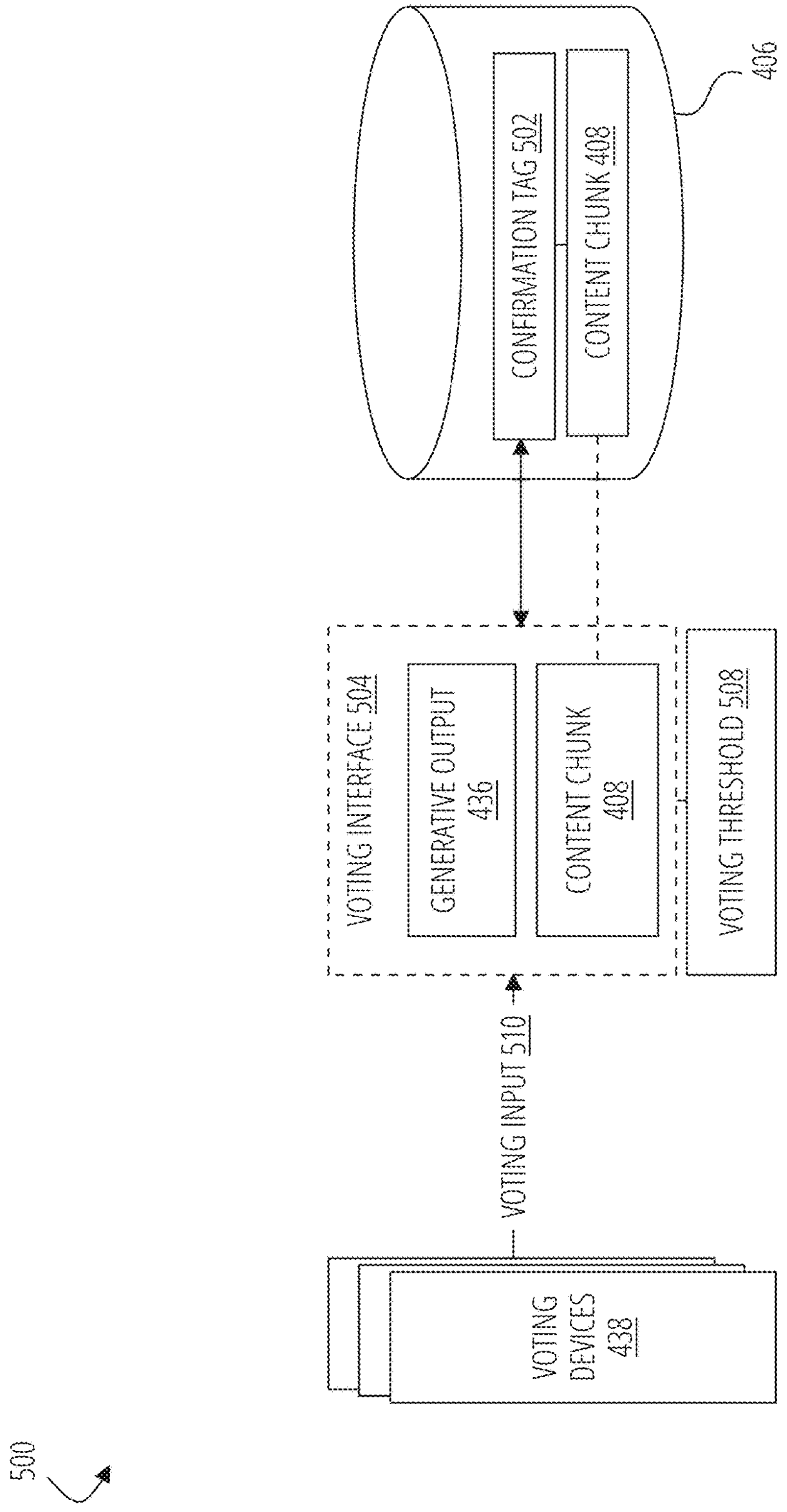
FIG. 5 is a dataflow diagram of a confirmation tag feedback scheme in accordance with some embodiments of the present disclosure.

FIG. 5 is a dataflow diagram of a confirmation tag feedback scheme 500 in accordance with some embodiments of the present disclosure. The confirmation tag feedback scheme 500 may be implemented by a computing system, such as the computing system 101, to iteratively monitor, enhance, and/or validate data within a RAG datastore 406. To do so, the confirmation tag feedback scheme 500 may implement a voting-based feedback loop designed to aggregate feedback from a set of voting devices 438 with respect to the data stored within the RAG datastore 406 and/or incoming data for the RAG datastore 406. The confirmation tag feedback scheme 500 may be initiated during an instruction finetuning process to selectively confirm content chunks 408 as they are incorporated to a generative prompt 432. This allows the confirmation tag feedback scheme 500 to adaptively process portions of a RAG datastore 406 based on their relevance to incoming queries, while preventing hallucinations during inference. In some examples, the confirmation tag feedback scheme 500 may enhance the RAG datastore 406 with new data, such as confirmed generative outputs 436 to continuously grow the RAG datastore 406 through targeted feedback. This, in turn, improves the accuracy, adaptability, and tolerance of RAG-based instruction finetuning and streamlines the allocation of limited processing resources.

In some embodiments, the confirmation tag 502 is based on a threshold number (e.g., voting threshold 508) of voting inputs 510 for the content chunk 408. For example, the confirmation tag may define an unconfirmed state and/or a confirmed state for the content chunk 408. The confirmation tag 502, for example, may comprise a type of preprocessing tag that identifies whether a particular content chunk aligns with procedural practices within a domain. To do so, the confirmation tag 502 may define an unconfirmed state (e.g., 0) and/or a confirmed state (e.g., 1). By way of example, the confirmation tag 502 may be implemented as a binary flag. In addition, or alternatively, the confirmation tag 502 may be implemented as an enumerated type (e.g., confirmed, unconfirmed).

In some embodiments, the computing system 101 sets (e.g., initializes) the confirmation tag 502 to identify the unconfirmed state for the content chunk 408 as it is stored within the RAG datastore 406. The confirmation tag 502 may remain in the unconfirmed state until it is confirmed through a set of voting inputs 510 from a set of voting devices 438 associated with a domain. The set of voting inputs 510, for example, may be received in response to the use of content chunk 408 within a generative prompt, as described with reference to FIG. 4. By way of example, in response to a generative output 436 that is based on at least one unconfirmed content chunk (e.g., a content chunk 408 in an unconfirmed state), the computing system 101 may provide the generative output 436 and/or the content chunk 408 to the set of voting devices 438. In some examples, the generative output 436 and/or content chunk 408 may be provided directly to the voting devices 438 (e.g., via a network connection). In addition, or alternatively, the generative output 436 and/or content chunk 408 may be published to an intermediary interface, such as the voting interface 504. The voting interface 504, for example, may comprise an intermediary interface that may be hosted by the computing system 101 and/or another computing system and may be accessible to up to each of the voting devices 438. In this way, the voting interface 504 may provide a virtual interface through which voting devices 438 may interact (e.g., by rendering the voting interface 504 within a display) to provide voting inputs 510.

The computing system 101 may receive, from a set of voting devices 438, a set of voting inputs 510 for the content chunk 408. In response to the set of voting inputs 510 meeting or exceeding the voting threshold 508, the computing system 101 may modify the confirmation tag 502 to identify the confirmed state.

In some embodiments, a voting input 510 comprises a data object that identifies an input from an authorized entity for a generative output 436 and/or content chunk 408. The voting input 510, for example, may comprise user input, agentic input, and/or the like, which confirms and/or denies a validity (e.g., accuracy) of the generative output 436 and/or content chunk 408. By way of example, the voting input 510 may comprise an identifier of the generative output 436 and/or content chunk 408 being voted on, the identifier of the voter (e.g., user, agent), the vote itself (e.g., confirm or reject), and/or additional metadata, such as a timestamp, one or more comments, and/or the like. In this manner, the voting input 510 may provide a feedback mechanism for incorporating the user and/or agentic validation of the information stored within the RAG datastore 406. By doing so, the voting inputs 510 enable the iterative maintenance and improvement of the RAG datastore 406.

By way of example, in response to the voting input 510 meeting or exceeding the voting threshold 508, the computing system 101 may use the value of the voting input 510 (e.g., confirm or deny) to modify the confirmation tag 502 of a content chunk 408. This, in turn, may trigger changes in how content chunk 408 is used in the feedback integrated RAG framework to reduce hallucinations, address data staleness, and/or the like.

In some embodiments, the voting threshold 508 is a static and/or dynamic numerical value, such as 10, 100, and/or the like. In addition, or alternatively, the voting threshold 508 may comprise a ratio of available voting devices 438, and/or any other form of restriction on a number of voting devices 438 required to act on a set of voting inputs 510. The voting threshold 508, for example, may be set based on a tolerance for a particular domain. For instance, the voting threshold 508 may be increased for low tolerance domains, such as data security, computer security, critical healthcare tasks, and/or the like. In addition, or alternatively, in high tolerance domains the voting threshold 508 may be decreased. In any domain, the voting threshold 508 may be determined based on a balance between the accuracy of the RAG datastore 406 (and by extension the generative model) and the expense (e.g., time, processing resources) of the confirmation tag feedback scheme 500.

Figure 6:
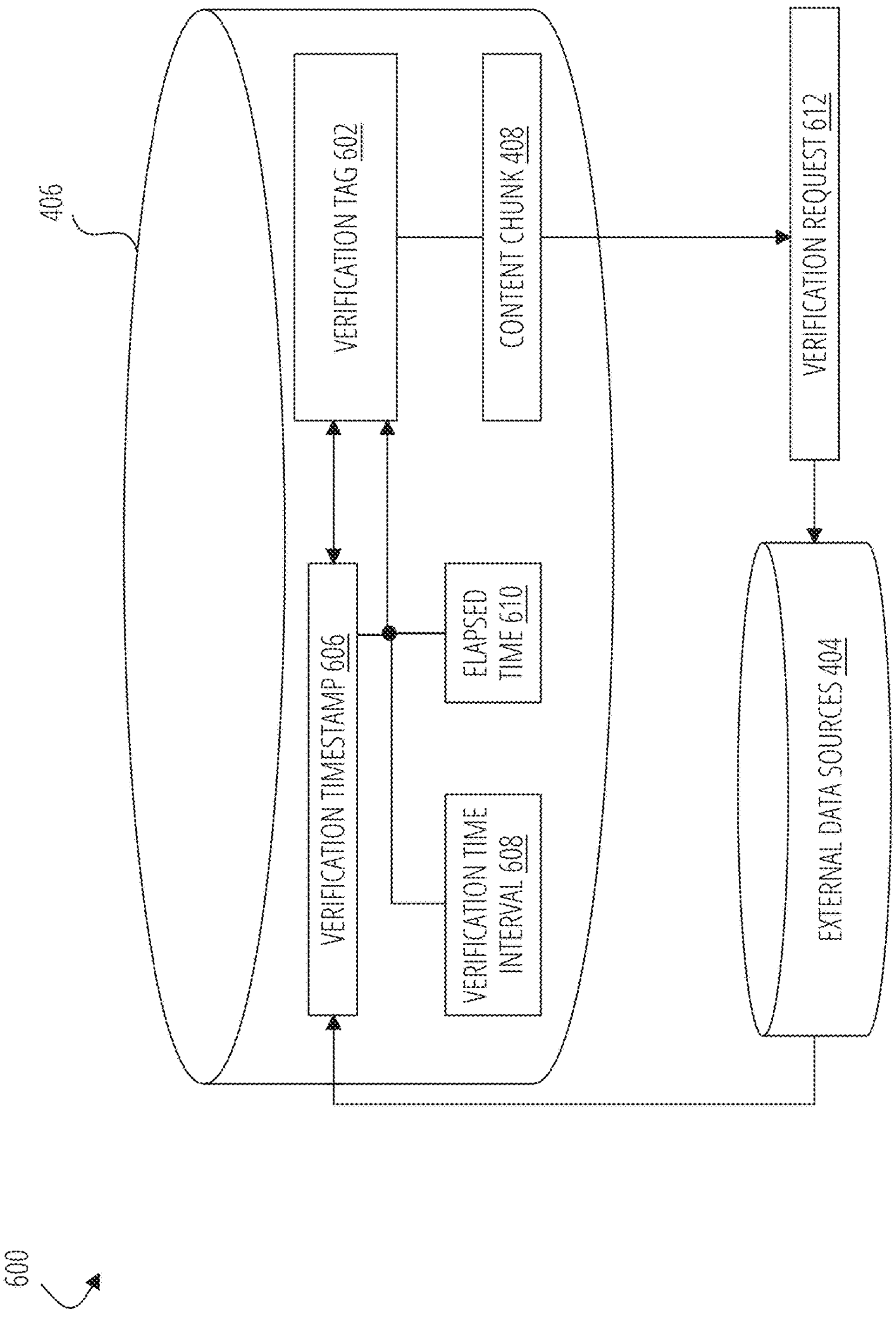
FIG. 6 is a dataflow diagram of a verification tag feedback scheme in in accordance with some embodiments of the present disclosure.

FIG. 6 is a dataflow diagram of a verification tag feedback scheme 600 in in accordance with some embodiments of the present disclosure. The verification tag feedback scheme 600 may be implemented by a computing system, such as the computing system 101, to repeatedly monitor, enhance, and validate factual data within a RAG datastore 406. To do so, the verification tag feedback scheme 600 may implement a source-based feedback loop designed to retrieve feedback from a source of truth (e.g., external data source 404) with respect to the data stored within the RAG datastore 406 and/or incoming data for the RAG datastore 406. The verification tag feedback scheme 600 may be initiated during an instruction finetuning process to selectively verify content chunks 408 as they are incorporated to a generative prompt 432. This allows the verification tag feedback scheme 600 to adaptively process portions of a RAG datastore 406 based on their relevance to incoming queries, while preventing inaccuracy due to data staleness during inference. This, in turn, improves the accuracy, adaptability, and tolerance of RAG-based instruction finetuning and streamlines the allocation of limited processing resources.

In some embodiments, the verification tag 602 is based on a verification timestamp 606 and/or a verification time interval 608 for the content chunk 408. For example, the verification tag may define an unverified state and/or a verified state for the content chunk 408. The verification tag 602, for example, may comprise a type of preprocessing tag that identifies whether a particular content chunk is factual accurate at a current time point in time. To do so, the verification tag 602 may define an unverified state (e.g., 0) and/or a verified state (e.g., 1). By way of example, the verification tag 602 may be implemented as a binary flag. In addition, or alternatively, the verification tag 602 may be implemented as an enumerated type (e.g., verified, unverified). In a addition, or alternatively, the verification tag 602 may comprise and/or be stored in association with one or more contextual attributes, such a verification timestamp 606, a source of verification (e.g., the external data source 404), and/or the like.

The verification timestamp 606, for example, may comprise a recorded time in which a verification tag 602 is assigned, modified, updated, and/or the like. In addition, or alternatively, the verification timestamp 606 may comprise a recorded time corresponding to a latest verification response for the verification tag 602. The verification timestamp 606, for example, may serve as a reference point for determining the currency and/or reliability of the information represented by a content chunk 408. The verification timestamp 606 may comprise any temporal format, such as a datetime field associated with the verification tag 602, Unix timestamp, an ISO 8601 datetime string, and/or the like. In some examples, the verification timestamp 606 may comprise the same format as an elapsed time 610 measure and/or verification time interval 608 to facilitate comparisons between the verification timestamp 606, an elapsed time 610, and/or the verification time interval 608.

In some embodiments, the computing system 101 sets (e.g., initializes) the verification tag 602 to identify verified state for the content chunk 408 as it is stored within the RAG datastore 406. The verification tag 602 may remain in the verified state until an elapsed time 610 from the verification timestamp 606 meets or exceeds a verification time interval 608 at which point the computing system 101 may reset the verification tag 602 to identify an unverified state for the content chunk 408 until it is verified through a verification request 612 to an external data source 404.

In addition, the computing system 101 sets (e.g., initializes) the verification tag 602 to identify an unverified state for the content chunk 408 as it is stored within the RAG datastore 406. The verification tag 602 may remain in the unverified state until it is verified through a verification request 612 to an external data source 404. In some embodiments, the computing system 101 provides, to at least one of the external data sources 404, a verification request 612 to receive a verification response for the content chunk 408. The verification request 612, for example, may comprise a request message, such as a SQL query, an API call, gRPC call, and/or the like that identifies content chunk 408 and requests a verification of the information within the content chunk 408.

The verification request 612 may be provided to an external data source 404 associated with the content chunk 408. The external data source 404, for example, may comprise a data repository of information that may be called to verify the factual accuracy of content chunk 408. For instance, the external data source 404 may comprise an external source of information that may serve as an independent reference point for validating information in the RAG datastore 406.

The external data source 404 may be any system that provides a reliable interface for querying factual information. For instance, the external data source 404 may comprise APIs provided by authoritative organizations, public databases, trusted web services, artificial intelligence systems specialized in fact verification, and/or the like.

In some embodiments, the computing system 101 receives a verification response in response to the verification request 612. The verification response may comprise a data object that identifies a response from an external data source 404 for a content chunk 408. The verification response, for example, may comprise a confirmation message and/or a denial message that confirms or denies a validity (e.g., accuracy) of the content chunk 408 at a particular point in time. The particular point in time, for example, may be recorded by a response timestamp within the verification response.

By way of example, the verification response may comprise an identifier of the content chunk 408, the identifier of the external data source 404, the confirmation or denial, and/or additional metadata, such as the request timestamp, one or more comments, and/or the like. By way of example, the additional metadata within a denial message may comprise a new, verified content chunk to replace the content chunk 408. In such a case, the computing system 101 may remove the content chunk 408, and/or modify the verification tag 602 of the content chunk 408, and replace the content chunk 408 with verified content chunk of the verification response. In this manner, the verification response may provide a feedback mechanism for tracking and modifying the data within a RAG datastore 406 to ensure its factual accuracy over time. By doing so, the verification responses enable the iterative maintenance and improvement of the RAG datastore 406 to address data staleness challenges for generative models.

In some embodiments, in response to a determination that the verification response verifies the content chunk 408, the computing system 101 modifies the verification tag 602 to identify the verified state and resets the verification timestamp 606. For example, the computing system 101 may set the verification timestamp 606 to a timestamp of the verification response. In addition, or alternatively, the computing system 101 may set the verification timestamp 606 to a current time (e.g., recorded by an internal clock mechanism of the computing system 101, queried from an external data source).

In some embodiments, in response to a determination that an elapsed time 610 from the verification timestamp 606 meets or exceeds the verification time interval 608, the computing system 101 resets the verification tag 602 to identify the unverified state. The verification time interval 608, for example, may comprise a static and/or dynamic time interval that defines a staleness of a factual content chunk. For example, the verification time interval 608 may comprise a refresh time interval for a verification tag 602 that may be set to avoid stale data. By way of example, the verification time interval 608 may comprise a duration value associated with up to each type of factual content, up to each individual content chunk 408, and/or like. The verification time interval 608 may be stored as a number of seconds, hours, days, and/or as one or more functions that enable for variable intervals based on content characteristics, external factors, and/or the like. By way of example, a verification time interval 608 may be defined by a timing function that accelerates and/or decelerates a static duration based on external stimuli, such as a detection of one or more changes within a domain, and/or the like.

In some examples, the verification time interval 608 may be based on a domain and/or a rate of change within a domain. By way of example, a verification time interval 608 may be increased in static domains with low rate of change over time. In addition, or alternatively, the verification time interval 608 may be decrease in dynamic domains with high rates of change over time. In any domain, the verification time interval 608 may be determined based on a balance between the accuracy of the RAG datastore 406 (and by extension the generative model) and the expense (e.g., time, processing resources) of the verification tag feedback scheme 600.

Figure 7:
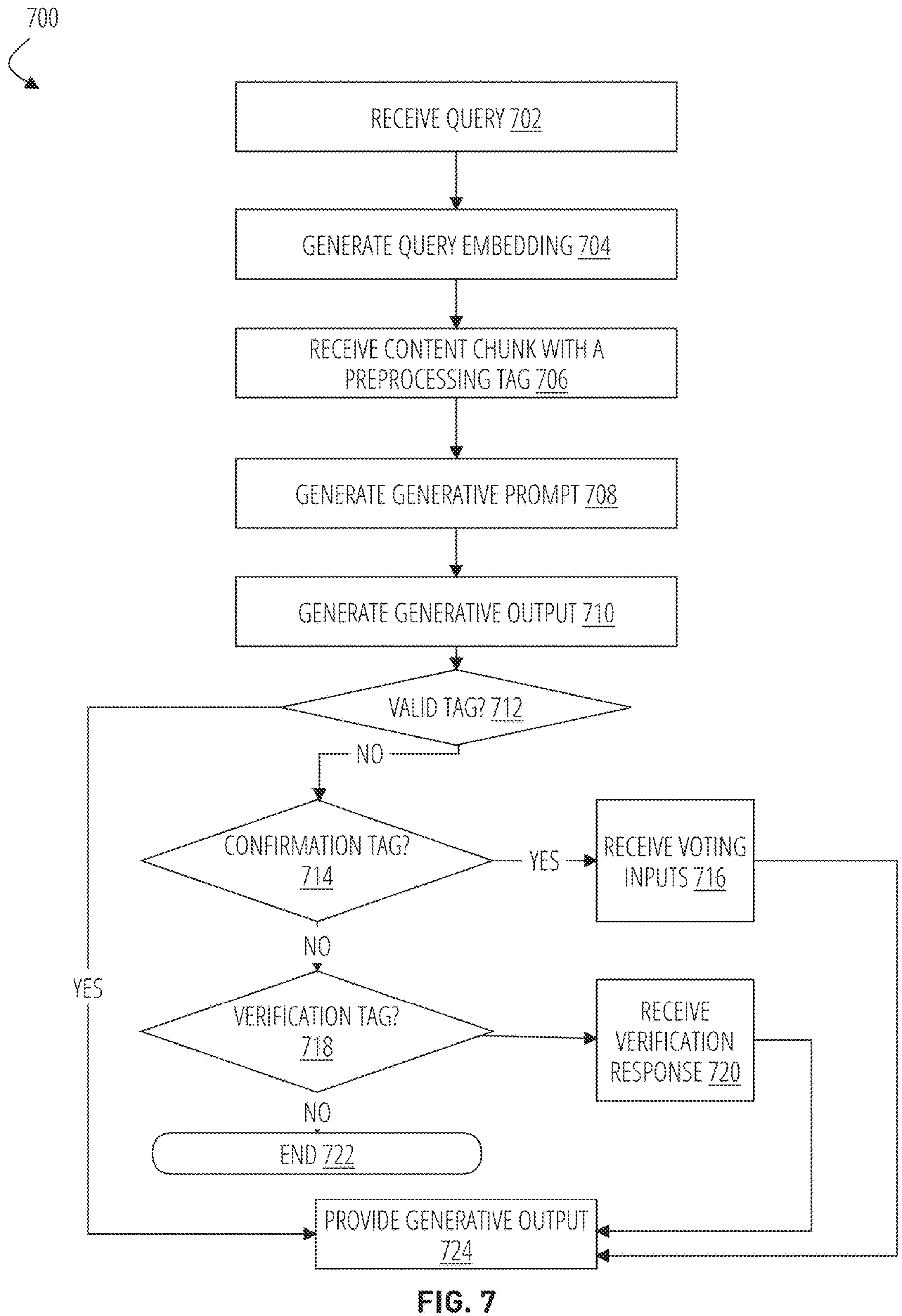
FIG. 7 is a flowchart diagram of feedback integrated RAG process in accordance with some embodiments of the present disclosure.

FIG. 7 is a flowchart diagram of feedback integrated RAG process 700 in accordance with some embodiments of the present disclosure. The flowchart diagram depicts an enhanced RAG technique that improves the accuracy and adaptability of generative models through improved instruction finetuning. The process 700 may be implemented by one or more computing devices, entities, and/or systems described herein. For example, via the various steps/operations of the process 700, the computing system 101 may implement a set of tags within a RAG datastore that may be periodically modified through feedback to improve the accuracy of data within the RAG datastore. By doing so, the process 700 may improve computer functionality by addressing hallucination and data staleness challenges that traditionally degrade the performance (e.g., in terms of accuracy and adaptability) of generative models.

FIG. 7 illustrates an example process 700 for explanatory purposes. Although the example process 700 depicts a particular sequence of steps/operations, the sequence may be altered without departing from the scope of the present disclosure. For example, some of the steps/operations depicted may be performed in parallel or in a different sequence that does not materially impact the function of the process 700. In other examples, different components of an example device or system that implements the process 700 may perform functions at substantially the same time or in a specific sequence.

In some embodiments, the process 700 comprises, at operation 702, receiving a query. For example, the computing system 101 may receive a query comprising a request content for a generative model.

In some embodiments, the process 700 comprises, at operation 704, generating a query embedding. For example, the computing system 101 may generate, using an embedding model, a query embedding for the query by embedding the request content.

In some embodiments, the process 700 comprises, at operation 706, receiving a content chunk with a preprocessing tag. For example, the computing system 101 may receive, from a RAG datastore, a content chunk based on the query embedding and a content embedding of the content chunk. For example, the computing system 101 may determine an embedding similarity score between the query embedding and the content embedding.

In some examples, the computing system 101 may determine, based on the embedding similarity score, an initial subset of content chunks from a set of content chunks within the RAG datastore. The computing system 101 may determine, using a reranker model, a similarity score between the request content and/or the content chunk. In some examples, the computing system 101 may determine, based on the similarity score, a refined subset of content chunks from the initial subset of content chunks. The refined subset of content chunks, for example, may comprise the content chunk.

In some embodiments, the content chunk is assigned a preprocessing tag. In some examples, the preprocessing tag may comprise a confirmation tag that is based on a threshold number of voting inputs for the content chunk. In addition, or alternatively, the preprocessing tag may comprise a verification tag that is based on a verification timestamp and a verification time interval. By way of example, the preprocessing tag may comprise at least one of a confirmation tag and/or a verification tag. The RAG datastore may comprise a set of content chunks, including the content chunk. The set of content chunks may comprise a subset of procedural content chunks and/or a subset of factual content chunks. In some examples, up to each of the subset of procedural content chunks may be associated with a confirmation tag. In addition, or alternatively, up to each of the subset of factual content chunks may be associated with a verification tag.

In some embodiments, the process 700 comprises, at operation 708, generating a generative prompt. For example, the computing system 101 may generate a generative prompt for the query and that comprises (i) prompt instructions, (ii) the request content, and/or (iii) the content chunk.

In some embodiments, the process 700 comprises, at operation 710, generating a generative output. For example, the computing system 101 may generate, using the generative model, a generative output based on the generative prompt.

In some embodiments, the process 700 comprises, at operation 712, routing the generative output based on the preprocessing tag. For example, the computing system 101 may determine whether the preprocessing tag for at least one of the content chunks within the generative prompt is valid or invalid. By way of example, a confirmation tag may be valid if it identifies a confirmed state (e.g., "1"). In addition, or alternatively, a verification tag may be valid if it identifies a verified state (e.g., "1"). In the event that up to each of the content chunks is associated with a valid preprocessing tag, the process 700 may proceed to operation 724, where the process 700 may route the generative output to a provider of the query in response to the query. Otherwise, the process 700 may proceed to operation 714, where the process 700 may handle a confirmation tag.

In some embodiments, the process 700 comprises, at operation 714, determining whether an invalid preprocessing tag is a confirmation tag. For example, the computing system 101 may determine whether the invalid preprocessing tag is a confirmation tag. For example, the confirmation tag may define an unconfirmed state and/or a confirmed state for the content chunk. The computing system 101 may set the confirmation tag to identify the unconfirmed state. The computing system 101 may receive, from a set of voting devices, a set of voting inputs for the content chunk. In response to the set of voting inputs meeting or exceeding the threshold number of voting inputs for the content chunk, the computing system 101 may modify the confirmation tag to identify the confirmed state.

In the event that the preprocessing tag is a confirmation tag, the process 700 may proceed to operation 716, where the process 700 may initiate a voting process for the generative output and/or the content chunks associated therewith. Otherwise, the process 700 may proceed to operation 718, where the process 700 may handle a verification tag.

In some embodiments, the process 700 comprises, at operation 716, receiving voting inputs for the generative output. For example, in response to a determination that the preprocessing tag identifies an unconfirmed state for the content chunk, the computing system 101 may provide the generative output and the content chunk to a set of voting devices. In some examples, in response to receiving a set of voting inputs from the set of voting devices that meet or exceed a threshold number of voting inputs, the computing system 101 may provide the generative output in response to the query, store the query and the generative output within the RAG datastore as a query-output content chunk, and modify the preprocessing tag to identify a confirmed state for the content chunk.

In some embodiments, the process 700 comprises, at operation 718, determining whether an invalid preprocessing tag is a verification tag. For example, the computing system 101 may determine whether the invalid preprocessing tag is a verification tag. For instance, the verification tag may define an unverified state and/or a verified state for the content chunk. The computing system 101 may set the verification tag to identify the unverified state. The computing system 101 may provide, to an external data source, a verification request to receive a verification response for the content chunk. In response to a determination that the verification response verifies the content chunk, the computing system 101 may modify the verification tag to identify the verified state and/or set the verification timestamp to a timestamp of the verification response. In addition, or alternatively, in response to a determination that an elapsed time from the verification timestamp meets or exceeds the verification time interval, the computing system 101 may reset the verification tag to identify the unverified state.

In the event that the preprocessing tag is a verification tag, the process 700 may proceed to operation 720, where the process 700 may initiate a verification process for the generative output and/or the content chunks associated therewith. Otherwise, the process 700 may proceed to operation 722, where the process 700 may issue a tag error indicating that a tag is unidentifiable. The process 700 may end at operation 722 without resolving the query.

In some embodiments, the process 700 comprises, at operation 720, receiving a verification response for the generative output. For example, in response to a determination that the preprocessing tag identifies an unverified state for the content chunk, the computing system 101 may provide, to an external data source, a verification request to receive a verification response for the content chunk. In response to a determination that the verification response verifies the content chunk, the computing system 101 may provide the generative output in response to the query.

In some embodiments, the process 700 comprises, at operation 724, providing the generative output. For example, the computing system 101 may, in response to a determination that the preprocessing tag identifies at least one of a confirmed state or a verified state for the content chunk, provide the generative output in response to the query.

Some techniques of the present disclosure enable the generation of action outputs that may be performed to initiate one or more real world actions to achieve real-world effects. The techniques of the present disclosure may be used, applied, and/or otherwise leveraged to generate generative outputs in various contexts. In some examples, the generative outputs of the present disclosure may trigger action outputs (e.g., through control instructions) to automate robotic devices (e.g., through end-to-end robotics platforms), and/or perform any other generative task. The action outputs may control various aspects of a client device, such as the display, transmission, and/or the like of data reflective of an alert, and/or the like. The alert may be automatically communicated to a user and/or may be used to initiate a security protocol (e.g., locking a computer), a robotic action (e.g., performing an automated screening process), and/or the like.

In some examples, the computing tasks may comprise actions that may be based on a particular domain. A domain may comprise any environment in which computing systems may be applied to interpret, store, and process data and initiate the performance of computing tasks responsive to the data. These actions may cause real-world changes, for example, by controlling a hardware component, providing alerts, interactive actions, and/or the like. For instance, actions may comprise the initiation of automated instructions across and between devices, automated notifications, automated scheduling operations, automated precautionary actions, automated security actions, automated data processing actions, and/or the like.

IV. CONCLUSION

Throughout this specification, components, operations, or structures described as a single instance may be implemented as multiple instances. Although individual operations of one or more methods (or processes, techniques, routines, etc.) are illustrated and described as separate operations, two or more of the individual operations may be performed concurrently or otherwise in parallel, and nothing requires that the operations be performed in the order illustrated. Structures and functionality (e.g., operations, steps, blocks) presented as separate components in example configurations may be implemented as a combined structure, functionality, or component. Similarly, structures and functionality presented as a single component may be implemented as separate components. These and other variations, modifications, additions, and improvements fall within the scope of the subject matter herein.

Certain embodiments are described herein as including logic or a number of routines, subroutines, applications, operations, blocks, or instructions. These may constitute and/or be implemented by software (e.g., code embodied on a non-transitory, machine-readable medium), hardware, or a combination thereof. In hardware, the routines, etc., may represent tangible units capable of performing certain operations and may be configured or arranged in a certain manner. In example embodiments, one or more computer systems (e.g., a standalone, client or server computer system) or one or more hardware modules of a computer system (e.g., a processor or a group of processors) may be configured by software (e.g., an application or application portion) as a hardware component that operates to perform certain operations as described herein.

In various embodiments, a hardware component may be implemented mechanically or electronically. For example, a hardware component may comprise dedicated circuitry or logic that is permanently configured (e.g., as a special-purpose processor, such as a field programmable gate array (FPGA) or an application-specific integrated circuit (ASIC)) to perform certain operations. A hardware component may also or instead comprise programmable logic or circuitry (e.g., as encompassed within one or more general-purpose processors and/or other programmable processor(s)) that is temporarily configured by software to perform certain operations.

Accordingly, the term "hardware component" should be understood to encompass a tangible entity, be that an entity that is physically constructed, permanently configured (e.g., hardwired), or temporarily configured (e.g., programmed) to operate in a certain manner or to perform certain operations described herein. Considering embodiments in which hardware components are temporarily configured (e.g., programmed), each of the hardware components need not be configured or instantiated at any one instance in time. For example, where the hardware components comprise a general-purpose processor configured using software, the general-purpose processor may be configured as respective different hardware components at different times. Software may accordingly configure a processor, for example, to constitute a particular hardware component at one instance of time and to constitute a different hardware component at a different instance of time.

Hardware components may provide information to, and receive information from, other hardware components. Accordingly, the described hardware components may be regarded as being communicatively coupled. Where multiple of such hardware components exist contemporaneously, communications may be achieved through signal transmission (e.g., over appropriate circuits and buses) that connect the hardware components. In embodiments in which multiple hardware components are configured or instantiated at different times, communications between such hardware components may be achieved, for example, through the storage and retrieval of information in memory structures to which the multiple hardware components have access. For example, one hardware component may perform an operation and store the output of that operation in a memory device to which it is communicatively coupled. A further hardware component may then, at a later time, access the memory device to retrieve and process the stored output. Hardware components may also initiate communications with input or output devices, and may operate on a resource (e.g., a collection of information).

As noted above, the various operations of example methods (or processes, techniques, routines, etc.) described herein may be performed, at least partially, by one or more processors that are temporarily configured (e.g., by software) or permanently configured to perform the relevant operations. Whether temporarily or permanently configured, such processors may constitute processor-implemented components that operate to perform one or more operations or functions. The components referred to herein may, in some example embodiments, comprise processor-implemented components.

Moreover, each operation of processes illustrated as logical flow graphs may represent a sequence of operations that may be implemented in hardware, software, or a combination thereof. In the context of software, the operations represent computer-executable instructions stored on one or more computer-readable storage media that, when executed by one or more processors, perform the recited operations. Generally, computer-executable instructions comprise routines, programs, objects, components, data structures, and the like that perform particular functions or implement particular data types. The order in which the operations are described is not intended to be construed as a limitation, and any number of the described operations may be combined in any order and/or in parallel to implement the processes.

The terms "coupled" and "connected," along with their derivatives, may be used. In particular embodiments, "connected" may be used to indicate that two or more elements are in direct physical or electrical contact with each other, although the context in the description may dictate otherwise when it is apparent that two or more elements are not in direct physical or electrical contact. "Coupled" may mean that two or more elements are in direct physical or electrical contact. However, "coupled" may also mean that two or more elements are not in direct contact with each other, yet still co-operate, transmit between, or interact with each other.

An algorithm may be considered to be a self-consistent sequence of acts or operations leading to a desired result. These comprise physical manipulations of physical quantities. Usually, though not necessarily, these quantities take the form of electrical, magnetic, or optical signals capable of being stored, transferred, combined, compared, and otherwise manipulated. These signals are commonly referred to as bits, values, elements, symbols, characters, terms, numbers, flags, or the like. It should be understood, however, that all of these and similar terms are to be associated with the appropriate physical quantities and are merely convenient labels applied to these quantities.

Unless specifically stated otherwise, discussions herein using words such as "processing," "computing," "calculating," "determining," "presenting," "displaying," or the like may refer to actions or processes of a machine (e.g., a computer) that manipulates or transforms data represented as physical (e.g., electronic, magnetic, or optical) quantities within one or more memories (e.g., volatile memory, non-volatile memory, or a combination thereof), registers, or other machine components that receive, store, transmit, or display information.

As used herein any reference to "some embodiments," "one embodiment," "an embodiment," "in some examples," or variations thereof means that a particular element, feature, structure, characteristic, operation, or the like described in connection with the embodiment is comprised in at least one embodiment, but not every embodiment necessarily comprises the particular element, feature, structure, characteristic, operation, or the like. Different instances of such a reference in various places in the specification do not necessarily all refer to the same embodiment, although they may in some cases. Moreover, different instances of such a reference may describe elements, features, structures, characteristics, operations, or the like be combined in any manner as an embodiment.

As used herein, the terms "comprises," "comprising," "comprises," "including," "has," "having" or any other variation thereof, are intended to cover a non-exclusive inclusion. For example, a process, method, article, or apparatus that comprises a list of elements is not necessarily limited to only those elements but may comprise other elements not expressly listed or inherent to such process, method, article, or apparatus. Further, unless the context of use clearly indicates otherwise, "or" refers to an inclusive or and not to an exclusive or. For example, a condition A or B is satisfied by any one of the following: A is true (or present) and B is false (or not present), A is false (or not present) and B is true (or present), and both A and B are true (or present).

The term "set" is intended to mean a collection of elements and may be a null set (i.e., a set containing zero elements) or may comprise one, two, or more elements. A "subset" is intended to mean a collection of elements that are all elements of a set, but that does not comprise other elements of the set. A first subset of a set may comprise zero, one, or more elements that are also elements of a second subset of the set. The first subset may be said to be a subset of the second subset if all the elements of the first subset are elements of the second subset, while also being a subset of the set. However, if all the elements of the second subset are also elements of the first subset (in addition to all the elements of the first subset being elements of the second subset), the first subset and the second subset are a single subset/not distinct.

For the purposes of the present disclosure, the term "a" or "an" entity refers to one or more of that entity. As such, the terms "a" or "an", "one or more", and "at least one" may be used interchangeably herein unless explicitly contradicted by the specification using the word "only one" or similar. For example, "a first element" may functionally be interpreted as "a first one or more elements" or a "first at least one element." Unless otherwise apparent from the context of use, reference in the present disclosure to a same set of "one or more processors" (or a same "plurality of processors," etc.) performing multiple operations may encompass implementations in which performance of the operations is divided among the processor(s) in any suitable way. For example, "generating, by one or more processors, X; and generating, by the one or more processors, Y" may encompass: (1) implementations in which a first subset of the processors (e.g., in a first computing device) generates X and an entirely distinct, second subset of the processors (e.g., in a different, second computing device) independently generates Y; (2) implementations in which one or more or all of the processor(s) (e.g., one or multiple processors in the same device, or multiple processors distributed among multiple devices) contribute to the generation of X and/or Y; and (3) other variations. This may similarly be applied to any other component or feature similarly recited (e.g., as "a component", "a feature", "one or more components", "one or more features", "a plurality of components", "a plurality of features"). Moreover, the performance of certain of the operations may be distributed among the one or more components, not only residing within a single machine, but deployed across a number of machines. The set of components may be located in a single geographic location (e.g., within a home environment, an office environment, a cloud environment). In other example embodiments, the set of components may be distributed across two or more geographic locations. Further, "a machine-learned model", equivalent terms (e.g., "machine learning model," "machine-learning model," "machine-learned component", "artificial intelligence", "artificial intelligence component"), or species thereof (e.g., "a large language model", "a neural network") may comprise a single machine-learned model or multiple machine-learned models, such as a pipeline comprising two or more machine-learned models arranged in series and/or parallel, an agentic framework of machine-learned models, or the like.

An "artificial intelligence" or "artificial intelligence component" may comprise a machine-learned model. A machine-learned model may comprise a hardware and/or software architecture having structural hyperparameters defining the model's architecture and/or one or more parameters (e.g., coefficient(s), weight(s), biase(s), activation function(s) and/or action function type(s) in examples where the activation function and/or function type is determined as part of training, clustering centroid(s)/medoid(s), partition(s), number of trees, tree depth, split parameters) determined as a result of training the machine-learned model based at least in part on training hyperparameters (e.g., for supervised, semi-supervised, and reinforcement learning models) and/or by iteratively operating the machine-learned model according to the training hyperparameters (e.g., for unsupervised machine-learned models).

In some examples, structural hyperparameter(s) may define component(s) of the model's architecture and/or their configuration/order, such as, for example, the configuration/order specifying which input(s) are provided to one component and which output(s) of that component are provided as input to other component(s) of the machine-learned model; a number, type, and/or configuration of component(s) per layer; a number of layers of the model; a number and/or type of input nodes in an input layer of the model; a number and/or type of nodes in a layer; a number and/or type of output nodes of an output layer of the model; component dimension (e.g., input size versus output size); a number of trees; a maximum tree depth; node split parameters; minimum number of samples in a leaf node of a tree; and/or the like. The component(s) of the model may comprise one or more activation functions and/or activation function type(s) (e.g., gated linear unit (GLU), such as a rectified linear unit (ReLU), leaky RELU, Gaussian error linear unit (GELU), Swish, hyperbolic tangent), one or more attention mechanism and/or attention mechanism types (e.g., self-attention, cross-attention), nodes and split indications and/or probabilities in a decision tree, and/or various other component(s) (e.g., adding and/or normalization layer, pooling layer, filter). Various combinations of any these components (as defined by the structural hyperparameter(s)) may result in different types of model architectures, such as a transformer-based machine-learned model (e.g., encoder-only model(s), encoder-decoder model(s), decoder-only models, generative pre-trained transformer(s) (GPT(s))), neural network(s), multi-layer perceptron(s), Kolmogorov-Arnold network(s), clustering algorithm(s), support vector machine(s), gradient boosting machine(s), and/or the like. The structural parameters and components a machine-learned model comprises may vary depending on the type of machine-learned model.

Training hyperparameter(s) may be used as part of training or otherwise determining the machine-learned model. In some examples, the training hyperparameter(s), in addition to the training data and/or input data, may affect determining the parameter(s) of the target machine-learned model. Using a different set of training hyperparameters to train two machine-learned models that have the same architecture (i.e., the same structural hyperparameters) and using the same training data may result in the parameters of the first machine-learned model differing from the parameters of the second machine-learned model. Despite having the same architecture and having been trained using the same training data, such machine-learned models may generate different outputs from each other, given the same input data. Accordingly, accuracy, precision, recall, and/or bias may vary between such machine-learned models.

In some examples, training hyperparameter(s) may comprise a train-test split ratio, activation function and/or activation function type (e.g., in examples like Kolmogorov-Arnold networks (KANs) where the activation function type is determined as part of training from an available set of activation functions and/or limits on the activation function parameters specified by the training hyperparameters), training stage(s) (e.g., using a first set of hyperparameters for a first epoch of training, a second set of hyperparameters for a second epoch of training), a batch size and/or number of batches of data in a training epoch, a number of epochs of training, the loss function used (e.g., L1, L2, Huber, Cauchy, cross entropy), the component(s) of the machine-learned model that are altered using the loss for a particular batch or during a particular epoch of training (e.g., some components may be "frozen," meaning their parameters are not altered based on the loss), learning rate, learning rate optimization algorithm type (e.g., gradient descent, adaptive, stochastic) used to determine an alteration to one or more parameters of one or more components of the machine-learned model to reduce the loss determined by the loss function, learning rate scheduling, and/or the like.

In some examples, the structural hyperparameters and/or the training hyperparameters may be determined by a hyperparameter optimization algorithm or based on user input, such as a software component written by a user or generated by a machine-learned model. The machine-learned model may comprise any type of model configured, trained, and/or the like to generate a prediction output for a model input. In some examples, any of the logic, component(s), routines, and/or the like discussed herein may be implemented as a machine-learned model.

The machine-learned model may comprise one or more of any type of machine-learned model including one or more supervised, unsupervised, semi-supervised, and/or reinforcement learning models. Training a machine-learned model may comprise altering one or more parameters of the machine-learned model (e.g., using a loss optimization algorithm) to reduce a loss. Depending on whether the machine-learned model is supervised, semi-supervised, unsupervised, etc. this loss may be determined based at least in part on a difference between an output generated by the model and ground truth data (e.g., a label, an indication of an outcome that resulted from a system using the output), a cost function, a fit of the parameter(s) to a set of data, a fit of an output to a set of data, and/or the like. In some examples, determining an output by a machine-learned model may comprise executing a set of inference operations executed by the machine-learned model according to the target machine-learned model's parameter(s) and structural hyperparameter(s) and using/operating on a set of input data.

Moreover, any discussion of receiving data associated with an individual that may be protected, confidential, or otherwise sensitive information, is understood to have been preceded by transmitting a notice of use of the data to a computing device, account, or other identifier (collectively, "identifier") associated with the individual, receiving an indication of authorization to use the data from the identifier, and/or providing a mechanism by which a user may cause use of the data to cease or a copy of the data to be provided to the user.

Upon reading this disclosure, those of skill in the art will appreciate still additional alternative structural and functional designs through the principles disclosed herein. Therefore, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

The patent claims at the end of this patent application are not intended to be construed under 35 U.S.C. § 112(f) unless traditional means-plus-function language is expressly recited, such as "means for" or "step for" language being explicitly recited in the claim(s).

V. EXAMPLES

Some embodiments of the present disclosure may be implemented by one or more computing devices, entities, and/or systems described herein to perform one or more example operations, such as those outlined below. The examples are provided for explanatory purposes. Although the examples outline a particular sequence of steps/operations, each sequence may be altered without departing from the scope of the present disclosure. For example, some of the steps/operations may be performed in parallel or in a different sequence that does not materially impact the function of the various examples. In other examples, different components of an example device or system that implements a particular example may perform functions at substantially the same time or in a specific sequence.

Moreover, although the examples may outline a system or computing entity with respect to one or more steps/operations, each step/operation may be performed by any one or combination of computing devices, entities, and/or systems described herein. For example, a computing system may comprise a single computing entity that is configured to perform the steps/operations of a particular example. In addition, or alternatively, a computing system may comprise multiple dedicated computing entities that are respectively configured to perform one or more of the steps/operations of a particular example. By way of example, the multiple dedicated computing entities may coordinate to perform the steps/operations of a particular example.

Example 1. A computer-implemented method comprising receiving, by one or more processors, a query comprising a request content for a generative model; generating, by the one or more processors and using an embedding model, a query embedding for the query by embedding the request content; receiving, by the one or more processors from a retrieval augmented generation (RAG) datastore, a content chunk based on the query embedding and a content embedding of the content chunk, wherein the content chunk is assigned a preprocessing tag; generating, by the one or more processors, a generative prompt for the query and that comprises (i) prompt instructions, (ii) the request content, and (iii) the content chunk; generating, by the one or more processors and using the generative model, a generative output based on the generative prompt; and routing, by the one or more processors, the generative output based on the preprocessing tag.

Example 2. The computer-implemented method of example 1, wherein the preprocessing tag comprises a confirmation tag that is based on a threshold number of voting inputs for the content chunk.

Example 3. The computer-implemented method of example 2, wherein the confirmation tag defines an unconfirmed state or a confirmed state for the content chunk and the confirmation tag is assigned by setting the confirmation tag identify the unconfirmed state; receiving, from a set of voting devices, a set of voting inputs for the content chunk; and in response to the set of voting inputs meeting or exceeding the threshold number of voting inputs for the content chunk, modifying the confirmation tag to identify the confirmed state.

Example 4. The computer-implemented method of any of the preceding examples, wherein the preprocessing tag comprises a verification tag that is based on a verification timestamp and a verification time interval.

Example 5. The computer-implemented method of example 4, wherein the verification tag defines an unverified state or a verified state for the content chunk and the verification tag is assigned by setting the verification tag to identify the unverified state; providing, to an external data source, a verification request to receive a verification response for the content chunk; in response to a determination that the verification response verifies the content chunk, (i) modifying the verification tag to identify the verified state and (ii) setting the verification timestamp to a timestamp of the verification response; and in response to a determination that an elapsed time from the verification timestamp meets or exceeds the verification time interval, resetting the verification tag to identify the unverified state.

Example 6. The computer-implemented method of any of the preceding examples, wherein routing the generative output based on the preprocessing tag comprises, in response to a determination that the preprocessing tag identifies at least one of a confirmed state or a verified state for the content chunk, providing the generative output in response to the query.

Example 7. The computer-implemented method of any of the preceding examples, wherein routing the generative output based on the preprocessing tag comprises, in response to a determination that the preprocessing tag identifies an unconfirmed state for the content chunk providing the generative output and the content chunk to a set of voting devices; and in response to receiving a set of voting inputs from the set of voting devices that meet or exceed a threshold number of voting inputs, (i) providing the generative output in response to the query, (ii) storing the query and the generative output within the RAG datastore as a query-output content chunk, and (iii) modifying the preprocessing tag to identify a confirmed state for the content chunk.

Example 8. The computer-implemented method of any of the preceding examples, wherein routing the generative output based on the preprocessing tag comprises, in response to a determination that the preprocessing tag identifies an unverified state for the content chunk providing, to an external data source, a verification request to receive a verification response for the content chunk; and in response to a determination that the verification response verifies the content chunk, (i) providing the generative output in response to the query.

Example 9. The computer-implemented method of any of the preceding examples, wherein (i) the preprocessing tag comprises at least one of a confirmation tag or a verification tag, (ii) the RAG datastore comprises a set of content chunks, (iii) the set of content chunks comprise a subset of procedural content chunks and a subset of factual content chunks, (iv) each of the subset of procedural content chunks is associated with a confirmation tag, and (v) each of the subset of factual content chunks is associated with a verification tag.

Example 10. The computer-implemented method of any of the preceding examples, wherein receiving the content chunk based on the query embedding and the content embedding of the content chunk comprises determining an embedding similarity score between the query embedding and the content embedding; determining, based on the embedding similarity score, an initial subset of content chunks from a set of content chunks within the RAG datastore; determining, using a reranker model, a relevancy score between the request content and the content chunk; and determining, based on the relevancy score, a refined subset of content chunks from the initial subset of content chunks, wherein the refined subset of content chunks comprises the content chunk.

Example 11. A system comprising one or more processors; and one or more memories storing processor-executable instructions that, when executed by the one or more processors, cause the one or more processors to perform operations comprising receiving a query comprising a request content for a generative model; generating, using an embedding model, a query embedding for the query by embedding the request content; receiving, from a retrieval augmented generation (RAG) datastore, a content chunk based on the query embedding and a content embedding of the content chunk, wherein the content chunk is assigned a preprocessing tag; generating a generative prompt for the query and that comprises (i) prompt instructions, (ii) the request content, and (iii) the content chunk; generating, using the generative model, a generative output based on the generative prompt; and routing the generative output based on the preprocessing tag.

Example 12. The system of example 11, wherein the preprocessing tag comprises a confirmation tag that is based on a threshold number of voting inputs for the content chunk.

Example 13. The system of example 12, wherein the confirmation tag defines an unconfirmed state or a confirmed state for the content chunk and the confirmation tag is assigned by setting the confirmation tag identify the unconfirmed state; receiving, from a set of voting devices, a set of voting inputs for the content chunk; and in response to the set of voting inputs meeting or exceeding the threshold number of voting inputs for the content chunk, modifying the confirmation tag to identify the confirmed state.

Example 14. The system of any of examples 11 through 13, wherein the preprocessing tag comprises a verification tag that is based on a verification timestamp and a verification time interval.

Example 15. The system of example 14, wherein the verification tag defines an unverified state or a verified state for the content chunk and the verification tag is assigned by setting the verification tag to identify the unverified state; providing, to an external data source, a verification request to receive a verification response for the content chunk; in response to a determination that the verification response verifies the content chunk, (i) modifying the verification tag to identify the verified state and (ii) setting the verification timestamp to a timestamp of the verification response; and in response to a determination that an elapsed time from the verification timestamp meets or exceeds the verification time interval, resetting the verification tag to identify the unverified state.

Example 16. The system of any of examples 11 through 15, wherein routing the generative output based on the preprocessing tag comprises, in response to a determination that the preprocessing tag identifies at least one of a confirmed state or a verified state for the content chunk, providing the generative output in response to the query.

Example 17. One or more non-transitory computer-readable media storing processor-executable instructions that, when executed by one or more processors, cause the one or more processors to perform operations comprising receiving a query comprising a request content for a generative model; generating, using an embedding model, a query embedding for the query by embedding the request content; receiving, from a retrieval augmented generation (RAG) datastore, a content chunk based on the query embedding and a content embedding of the content chunk, wherein the content chunk is assigned a preprocessing tag; generating a generative prompt for the query and that comprises (i) prompt instructions, (ii) the request content, and (iii) the content chunk; generating, using the generative model, a generative output based on the generative prompt; and routing the generative output based on the preprocessing tag.

Example 18. The one or more non-transitory computer-readable media of example 17, wherein routing the generative output based on the preprocessing tag comprises, in response to a determination that the preprocessing tag identifies an unconfirmed state for the content chunk providing the generative output and the content chunk to a set of voting devices; and in response to receiving a set of voting inputs from the set of voting devices that meet or exceed a threshold number of voting inputs, (i) providing the generative output in response to the query, (ii) storing the query and the generative output within the RAG datastore as a query-output content chunk, and (iii) modifying the preprocessing tag to identify a confirmed state for the content chunk.

Example 19. The one or more non-transitory computer-readable media of examples 17 or 18, wherein routing the generative output based on the preprocessing tag comprises, in response to a determination that the preprocessing tag identifies an unverified state for the content chunk providing, to an external data source, a verification request to receive a verification response for the content chunk; and in response to a determination that the verification response verifies the content chunk, (i) providing the generative output in response to the query.

Example 20. The one or more non-transitory computer-readable media of any of examples 17 through 19, wherein (i) the preprocessing tag comprises at least one of a confirmation tag or a verification tag, (ii) the RAG datastore comprises a set of content chunks, (iii) the set of content chunks comprise a subset of procedural content chunks and a subset of factual content chunks, (iv) each of the subset of procedural content chunks is associated with a confirmation tag, and (v) each of the subset of factual content chunks is associated with a verification tag.

Example 21. The computer-implemented method of example 1, wherein the method further comprises training the embedding model and the generative model.

Example 22. The computer-implemented method of example 21, wherein the training is performed by the one or more processors.

Example 23. The computer-implemented method of example 22, wherein the one or more processors are comprised in a first computing entity; and the training is performed by one or more other processors comprised in a second computing entity.

Example 24. The computing system of example 11, wherein the one or more processors are further configured to train the embedding model and the generative model.

Example 25. The computing system of example 24, wherein the one or more processors are comprised in a first computing entity; and the embedding model and the generative model are trained by one or more other processors comprised in a second computing entity.

Example 26. The one or more non-transitory computer-readable storage media of example 17, wherein the instructions further cause the one or more processors to train the embedding model and the generative model.

Example 27. The one or more non-transitory computer-readable storage media of example 26, wherein the one or more processors are comprised in a first computing entity; and the embedding model and the generative model are trained by one or more other processors comprised in a second computing entity.

What is claimed is:

1. A computer-implemented method comprising:

receiving, by one or more processors, a query comprising a request content for a generative model;

generating, by the one or more processors and using an embedding model, a query embedding for the query by embedding the request content;

receiving, by the one or more processors from a retrieval augmented generation (RAG) datastore, a content chunk based on the query embedding and a content embedding of the content chunk, wherein the content chunk is assigned a preprocessing tag;

generating, by the one or more processors, a generative prompt for the query and that comprises (i) prompt instructions, (ii) the request content, and (iii) the content chunk;

generating, by the one or more processors and using the generative model, a generative output based on the generative prompt; and routing, by the one or more processors, the generative output based on the preprocessing tag.

2. The computer-implemented method of claim 1, wherein the preprocessing tag comprises a confirmation tag that is based on a threshold number of voting inputs for the content chunk.

3. The computer-implemented method of claim 2, wherein the confirmation tag defines an unconfirmed state or a confirmed state for the content chunk and the confirmation tag is assigned by:

setting the confirmation tag to identify the unconfirmed state;

receiving, from a set of voting devices, a set of voting inputs for the content chunk; and in response to the set of voting inputs meeting or exceeding the threshold number of voting inputs for the content chunk, modifying the confirmation tag to identify the confirmed state.

4. The computer-implemented method of claim 1, wherein the preprocessing tag comprises a verification tag that is based on a verification timestamp and a verification time interval.

5. The computer-implemented method of claim 4, wherein the verification tag defines an unverified state or a verified state for the content chunk and the verification tag is assigned by:

setting the verification tag to identify the unverified state;

providing, to an external data source, a verification request to receive a verification response for the content chunk;

in response to a determination that the verification response verifies the content chunk, (i) modifying the verification tag to identify the verified state and (ii) setting the verification timestamp to a timestamp of the verification response; and in response to a determination that an elapsed time from the verification timestamp meets or exceeds the verification time interval, resetting the verification tag to identify the unverified state.

6. The computer-implemented method of claim 1, wherein routing the generative output based on the preprocessing tag comprises, in response to a determination that the preprocessing tag identifies at least one of a confirmed state or a verified state for the content chunk, providing the generative output in response to the query.

7. The computer-implemented method of claim 1, wherein routing the generative output based on the preprocessing tag comprises, in response to a determination that the preprocessing tag identifies an unconfirmed state for the content chunk:

providing the generative output and the content chunk to a set of voting devices; and in response to receiving a set of voting inputs from the set of voting devices that meet or exceed a threshold number of voting inputs, (i) providing the generative output in response to the query, (ii) storing the query and the generative output within the RAG datastore as a query-output content chunk, and (iii) modifying the preprocessing tag to identify a confirmed state for the content chunk.

8. The computer-implemented method of claim 1, wherein routing the generative output based on the preprocessing tag comprises, in response to a determination that the preprocessing tag identifies an unverified state for the content chunk:

providing, to an external data source, a verification request to receive a verification response for the content chunk; and in response to a determination that the verification response verifies the content chunk, (i) providing the generative output in response to the query.

9. The computer-implemented method of claim 1, wherein:

(i) the preprocessing tag comprises at least one of a confirmation tag or a verification tag, (ii) the RAG datastore comprises a set of content chunks, (iii) the set of content chunks comprises a subset of procedural content chunks and a subset of factual content chunks, (iv) each of the subset of procedural content chunks is associated with a confirmation tag, and (v) each of the subset of factual content chunks is associated with a verification tag.

10. The computer-implemented method of claim 1, wherein receiving the content chunk based on the query embedding and the content embedding of the content chunk comprises:

determining an embedding similarity score between the query embedding and the content embedding;

determining, based on the embedding similarity score, an initial subset of content chunks from a set of content chunks within the RAG datastore;

determining, using a reranker model, a relevancy score between the request content and the content chunk; and determining, based on the relevancy score, a refined subset of content chunks from the initial subset of content chunks, wherein the refined subset of content chunks comprises the content chunk.

11. A system comprising:

one or more processors; and one or more memories storing processor-executable instructions that, when executed by the one or more processors, cause the one or more processors to perform operations comprising:

receiving a query comprising a request content for a generative model;

generating, using an embedding model, a query embedding for the query by embedding the request content;

receiving, from a retrieval augmented generation (RAG) datastore, a content chunk based on the query embedding and a content embedding of the content chunk, wherein the content chunk is assigned a preprocessing tag;

generating a generative prompt for the query and that comprises (i) prompt instructions, (ii) the request content, and (iii) the content chunk;

generating, using the generative model, a generative output based on the generative prompt; and routing the generative output based on the preprocessing tag.

12. The system of claim 11, wherein the preprocessing tag comprises a confirmation tag that is based on a threshold number of voting inputs for the content chunk.

13. The system of claim 12, wherein the confirmation tag defines an unconfirmed state or a confirmed state for the content chunk and the confirmation tag is assigned by:

setting the confirmation tag to identify the unconfirmed state;

receiving, from a set of voting devices, a set of voting inputs for the content chunk; and in response to the set of voting inputs meeting or exceeding the threshold number of voting inputs for the content chunk, modifying the confirmation tag to identify the confirmed state.

14. The system of claim 11, wherein the preprocessing tag comprises a verification tag that is based on a verification timestamp and a verification time interval.

15. The system of claim 14, wherein the verification tag defines an unverified state or a verified state for the content chunk and the verification tag is assigned by:

setting the verification tag to identify the unverified state;

providing, to an external data source, a verification request to receive a verification response for the content chunk;

in response to a determination that the verification response verifies the content chunk, (i) modifying the verification tag to identify the verified state and (ii) setting the verification timestamp to a timestamp of the verification response; and in response to a determination that an elapsed time from the verification timestamp meets or exceeds the verification time interval, resetting the verification tag to identify the unverified state.

16. The system of claim 11, wherein routing the generative output based on the preprocessing tag comprises, in response to a determination that the preprocessing tag identifies at least one of a confirmed state or a verified state for the content chunk, providing the generative output in response to the query.

17. One or more non-transitory computer-readable media storing processor-executable instructions that, when executed by one or more processors, cause the one or more processors to perform operations comprising:

receiving a query comprising a request content for a generative model;

generating, using an embedding model, a query embedding for the query by embedding the request content;

receiving, from a retrieval augmented generation (RAG) datastore, a content chunk based on the query embedding and a content embedding of the content chunk, wherein the content chunk is assigned a preprocessing tag;

generating a generative prompt for the query and that comprises (i) prompt instructions, (ii) the request content, and (iii) the content chunk;

generating, using the generative model, a generative output based on the generative prompt; and routing the generative output based on the preprocessing tag.

18. The one or more non-transitory computer-readable media of claim 17, wherein routing the generative output based on the preprocessing tag comprises, in response to a determination that the preprocessing tag identifies an unconfirmed state for the content chunk:

providing the generative output and the content chunk to a set of voting devices; and in response to receiving a set of voting inputs from the set of voting devices that meet or exceed a threshold number of voting inputs, (i) providing the generative output in response to the query, (ii) storing the query and the generative output within the RAG datastore as a query-output content chunk, and (iii) modifying the preprocessing tag to identify a confirmed state for the content chunk.

19. The one or more non-transitory computer-readable media of claim 17, wherein routing the generative output based on the preprocessing tag comprises, in response to a determination that the preprocessing tag identifies an unverified state for the content chunk:

providing, to an external data source, a verification request to receive a verification response for the content chunk; and in response to a determination that the verification response verifies the content chunk, (i) providing the generative output in response to the query.

20. The one or more non-transitory computer-readable media of claim 17, wherein:

(i) the preprocessing tag comprises at least one of a confirmation tag or a verification tag, (ii) the RAG datastore comprises a set of content chunks, (iii) the set of content chunks comprises a subset of procedural content chunks and a subset of factual content chunks, (iv) each of the subset of procedural content chunks is associated with a confirmation tag, and (v) each of the subset of factual content chunks is associated with a verification tag.

* * * * *